US012671417B2

(12) United States Patent
Mishra et al.

(10) Patent No.: US 12,671,417 B2
(45) Date of Patent: Jun. 30, 2026

(54) QUBIT STATE PREPARATION USING QUANTUM STEERING

(71) Applicant: University of Florida Research Foundation, Incorporated, Gainesville, FL (US)

(72) Inventors: Prabhat Mishra, Gainesville, FL (US); Zhixin Pan, Gainesville, FL (US); Daniel Volya, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 18/953,458

(22) Filed: Nov. 20, 2024

(65) Prior Publication Data

US 2025/0226826 A1     Jul. 10, 2025

Related U.S. Application Data

(60) Provisional application No. 63/617,974, filed on Jan. 5, 2024.

(51) Int. Cl.
*H03K 17/92* (2006.01)
*G06N 10/70* (2022.01)

(52) U.S. Cl.
CPC ............. *H03K 17/92* (2013.01); *G06N 10/70* (2022.01)

(58) Field of Classification Search
CPC ..................................................... H03K 17/92
USPC ................................................ 327/527, 528
See application file for complete search history.

(56) References Cited

U.S. PATENT DOCUMENTS

2024/0428108 A1* 12/2024 Lee ......................... G06N 10/00

OTHER PUBLICATIONS

Khaneja, et al., "Optimal Control of Coupled Spin Dynamics: Design of NMR Pulse Sequences by Gradient Ascent Algorithms," *Journal of Magnetic Resonance*, vol. 172, No. 2, pp. 296-305, Dec. 2, 2005.
Petersson, et al., "Optimal Control of Closed Quantum Systems via B-Splines with Carrier Waves," *SIAM J. Sci.Comput.*, vol. 44, No. 6, pp. A3592-A3616, Dec. 2022, doi:10.1137/21M1429618.

(Continued)

*Primary Examiner* — Tomi Skibinski
(74) *Attorney, Agent, or Firm* — Alston & Bird LLP

(57) ABSTRACT

A quantum computer prepares system qubits into respective selected states by obtaining an initial steering circuit. The initial steering circuit is a quantum circuit comprising one or more quantum interactions between at least one detector qubit and the system qubits that is performable by the quantum computer. The quantum computer performs one or more iterations of causing the at least one detector qubit to be initialized into an initial detector state, causing performance of the steering circuit, and causing measurement of the at least one detector qubit. The quantum computer determines that the one or more system qubits are in the respective selected states. The quantum computer may then use the system qubits in performance of a quantum program. The initial steering circuit may be determined using a machine learning algorithm to determine parameters of a parameterized unitary operator enacted thereby. The steering circuit may be updated on each iteration.

20 Claims, 11 Drawing Sheets

(56) References Cited

OTHER PUBLICATIONS

Volya, et al., "Quantum Data Compression for Efficient Generation of Control Pulses," *Asia and South Pacific Design Automation Conference*, pp. 216-221, Jan. 16, 2023, doi:10.1145/3566097. 3567927.

Floether, et al., "Robust Quantum Gates for Open Systems via Optimal Control: Markovian versus Non-Markovian Dynamics," *New Journal of Physics*, vol. 14, No. 7, (27 pages), Jul. 11, 2012, doi:10.1088/1367-2630/14/7/073023.

Dong, et al., "Quantum Control Theory and Applications: A Survey," (38 pages), Jan. 10, 2011, arXiv:0910.2350v3.

Volya, et al., "Impact of Noise on Quantum Algorithms in NISQ Systems," *IEEE International Conference on Computer Design*, (2020), 4 pages.

Reed, et al., "Realization of Three-Qubit Quantum Error Correction with Superconducting Circuits," *Nature*, vol. 482, pp. 382-385, Feb. 16, 2012, doi:10.1038/nature 10786.

Takita, et al., "Experimental Demonstration of Fault-Tolerant State Preparation with Superconducting Qubits," *Physical Review Letters*, vol. 119, No. 18, (5 pages), Oct. 31, 2017, doi: 10.1103/ PhysRevLett.119.180501.

Kandala, et al., "Hardware-Efficient Variational Quantum Eigensolver for Small Molecules and Quantum Magnets," *Nature*, vol. 549, pp. 242-246, Sep. 14, 2017, doi:10.1038/nature23879.

O'Malley, et al, "Scalable Quantum Simulation of Molecular Energies," *Physical Review X*, vol. 6, (13 pages), Jul. 2016, doi:10.1103/ PhysRevX.6.031007.

Lanyon, et al, "Universal Digital Quantum Simulation with Trapped Ions," *Science*, vol. 334, pp. 57-61, Oct. 7, 2011.

Paz-Silva, et al., "Zeno Effect for Quantum Computation and Control," *Physical Review Letters*, vol. 108, (5 pages), Feb. 24, 2012, doi: 10.1103/PhysRevLett.108.080501.

Basilewitsch, et al., "Fundamental Bounds on Qubit Reset," *Physical Review Research*, vol. 3, (15 pages), Feb. 4, 2021, doi: 10.1103/ PhysRevResearch.3.013110.

Roy, et al., "Measurement-Induced Steering of Quantum Systems," *Physical Review Research*, vol. 2, (20 pages), Sep. 1, 2020, doi: 10.1103/PhysRevResearch.2.033347.

Herasymenko, et al., "Measurement-Driven Navigation in Many-Body Hilbert Space: Active-Decision Steering," *PRX Quantum*, vol. 4, Jun. 21, 2022, doi: 10.1103/PRXQuantum.4.020347.

Kumar, et al., "Engineering Two-Qubit Mixed States with Weak Measurements," *Physical Review Research*, vol. 2, (6 pages), Oct. 19, 2020, doi: 10.1103/PhysRevResearch.2.042014.

Kumar, et al., "Optimized Steering: Quantum State Engineering and Exceptional Points," *Physical Review A*, vol. 105, (6 pages), Jan. 18, 2022, doi: 10.1103/PhysRevA.105.L010203.

Volya, et al., "State Preparation on Quantum Computers via Quantum Steering," *Quantum Computing*, vol. 05, Jan. 24, 2024, (14 pages), doi:10.1109/TQE.2024.3358193.

Kraus, et al, "Preparation of Entangled States by Quantum Markov Processes," *Physical Review A*, vol. 78, (9 pages), Oct. 2008, doi: 10.1103/PhysRevA.78.042307.

Verstraete, et al., "Quantum Computation and Quantum-State Engineering Driven by Dissipation," *Nature Physics*, vol. 5, No. 9, pp. 633-636, Sep. 2009, doi: 10.1038/NPHYS1342.

Ahn, et al., "Continuous Quantum Error Correction via Quantum Feedback Control," *Physical Review A*, vol. 65, No. 4, (10 pages), Mar. 14, 2002, doi:10.1103/PhysRevA.65.042301.

Kak, "The Initialization Problem in Quantum Computing," *Foundations of Physics*, vol. 29, No. 2, pp. 267-279, Feb. 1999, doi: 10.1023/A:1018877706849.

Reed, et al., "Fast Reset and Suppressing Spontaneous Emission of a Superconducting Qubit," *Appl. Phys. Lett.*, vol. 96, No. 20, May 31, 2010, doi: 10.1063/1.3435463.

Geerlings, et al., "Demonstrating a Driven Reset Protocol for a Superconducting Qubit," *Physical Review Letters*, vol. 110, No. 12, Mar. 20, 2013, doi: 10.1103/PhysRevLett.110.120501.

Herasymenko, et al., "Measurement-Driven Navigation in Many-Body Hilbert Space: Active-Decision Steering," *PRX Quantum*, vol. 4, Jun. 21, 2023, doi: 10.1103/PRXQuantum.4.020347.

Grant, et al., "An Initialization Strategy for Addressing Barren Plateaus in Parametrized Quantum Circuits," *Quantum*, vol. 3, (9 pages), Nov. 27, 2019, doi: 10.22331/q-2019-12-09-214.

* cited by examiner

402 — OBTAIN INITIAL STEERING CIRCUIT

404 — CAUSE INITIALIZATION OF DETECTOR QUBIT(S) INTO INITIAL DETECTOR STATE

406 — CAUSE PERFORMANCE OF INITIAL STEERING CIRCUIT

408 — CAUSE MEASUREMENT OF DETECTOR QUBIT(S)

410 — STATE(S) OF SYSTEM QUBIT(S) CONVERGED?

NO

YES

412 — PERFORM QUANTUM PROGRAM

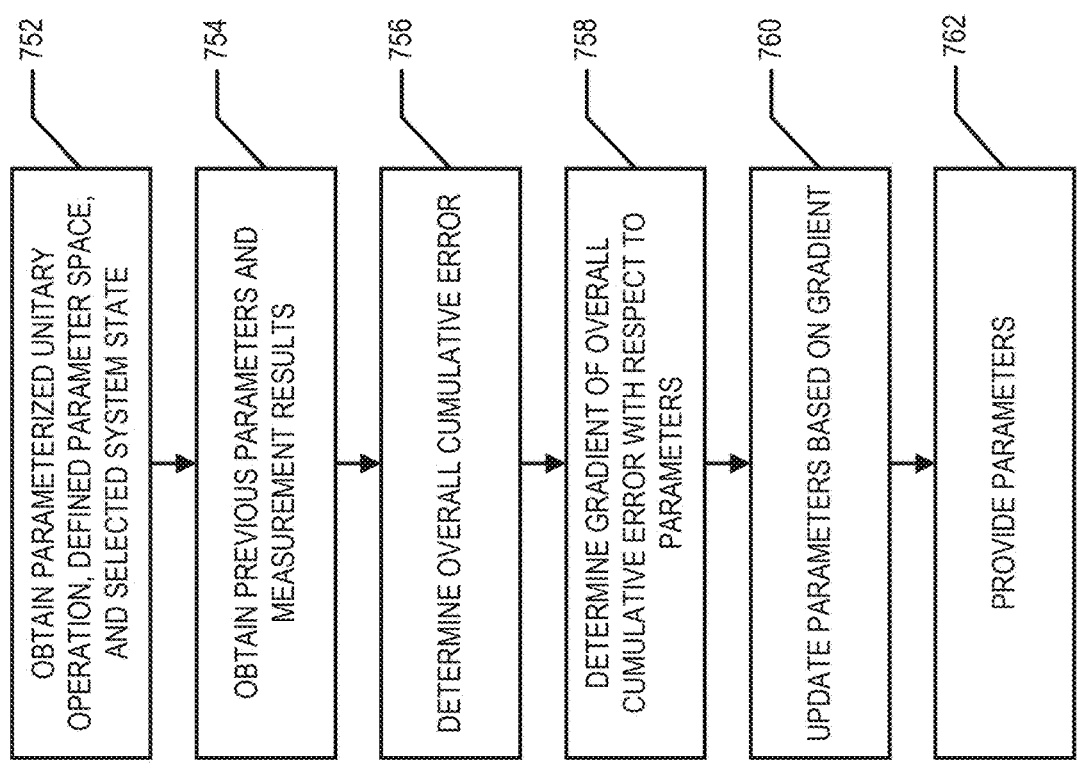
FIG. 7B
752 — OBTAIN PARAMETERIZED UNITARY OPERATION, DEFINED PARAMETER SPACE, AND SELECTED SYSTEM STATE
754 — OBTAIN PREVIOUS PARAMETERS AND MEASUREMENT RESULTS
756 — DETERMINE OVERALL CUMULATIVE ERROR
758 — DETERMINE GRADIENT OF OVERALL CUMULATIVE ERROR WITH RESPECT TO PARAMETERS
760 — UPDATE PARAMETERS BASED ON GRADIENT
762 — PROVIDE PARAMETERS
750

QUBIT STATE PREPARATION USING QUANTUM STEERING

CROSS-REFERENCE TO RELATED APPLICATION(S)

This application claims priority to U.S. Application No. 63/617,974, filed Jan. 5, 2024, the content of which is incorporated herein by reference in its entirety.

GOVERNMENT SUPPORT STATEMENT

This invention was made with government support under 1908131 awarded by the National Science Foundation. The government has certain rights in the invention.

TECHNICAL FIELD

The present disclosure relates to state preparation of qubits using quantum steering. An example embodiment relates to the use of machine learning to determine one or more unitary transformations used to perform quantum steering to prepare a state of one or more qubits.

BACKGROUND

Quantum computing can efficiently solve many hard problems significantly faster than its classical counterpart. Quantum state preparation is one of the critical steps in quantum computing that prepares qubits to be acted upon via a quantum program configured to perform a quantum computation. A quantum program includes one or more quantum circuits that are each a respective computational routine consisting of coherent quantum operations on quantum data, such as qubits. In other words, a quantum circuit is an ordered sequence of quantum gates, measurements, and resets. Performance of a quantum computation is accomplished through performance of a quantum program may include one or more quantum circuits. In order for the results of the quantum program to be interpretable (e.g., to determine a result of the quantum computation), the qubits must be in a known state at the beginning of the quantum program. In instances where the qubits are not in a known state at the beginning of the quantum program, the results of the quantum program are not able to be meaningfully interpreted.

BRIEF SUMMARY OF EXAMPLE EMBODIMENTS

Various embodiments provide methods, systems, apparatus, computer program products, and/or the like for preparing qubits of a quantum computer using quantum steering. For example, various embodiments, use quantum steering to steer system qubits into respective selected states via interactions with detector qubits, where the quantum state of the detector qubits are measured after performance of the interactions.

In an example embodiment, a quantum computer includes a plurality of qubits, a qubit measurement system, a qubit manipulation system, and a controller. The qubit measurement system is configured to measure, detect, and/or read the quantum state of one or more qubits of the plurality of qubits. The qubit manipulation system is configured to manipulate the quantum state of one or more qubits. The controller is configured to control operation of the qubit manipulation system and receive input from the qubit measurement system. The controller is configured to obtain a steering circuit. The steering circuit is a quantum circuit comprising one or more quantum interactions between at least one detector qubit and at least one system qubit that is performable by the quantum computer and is configured to steer the quantum state of the system qubits toward one or more selected qubit states. In an example embodiment, the initial steering circuit is determined through a machine learning algorithm. The controller is further configured to perform one or more iterations of causing the qubit manipulation system to initialize one or more detector qubits of the plurality of qubits into an initial detector state, causing the qubit manipulation system to perform the steering circuit, and causing the qubit measurement system to measure respective states of the one or more detector qubits. In an example embodiment, the steering circuit is updated each iteration based on the measurements of the detector qubits of the previous one or more iterations. The controller is further configured to determine that the one or more system qubits are in the selected qubit states.

According to a first aspect, a method for preparing one or more qubits in respective selected states. In an example embodiment, the method includes obtaining, by a quantum computer, an initial steering circuit. The initial steering circuit is a quantum circuit comprising one or more quantum interactions between at least one detector qubit and the one or more system qubits that is performable by the quantum computer. The quantum computer comprises a plurality of physical qubits that includes the at least one detector qubit and the one or more system qubits. The one or more quantum interactions of the initial steering circuit are characterized by a parameterized unitary operator and one or more parameters of the parameterized unitary operator determined using machine learning. In an example embodiment, the method further comprises performing, by the quantum computer, one or more iterations of causing the at least one detector qubit to be initialized into an initial detector state, causing performance of the initial steering circuit, and causing measurement of the at least one detector qubit. The method further comprises determining, by the quantum computer, that the one or more system qubits are in the respective selected states.

According to another aspect a method for preparing one or more qubits in respective selected states is provided. In an example embodiment, the method includes obtaining, by a quantum computer, an initial steering circuit. The initial steering circuit is a quantum circuit comprising one or more quantum interactions between at least one detector qubit and the one or more system qubits that is performable by the quantum computer. The quantum computer comprises a plurality of physical qubits that includes the at least one detector qubit and the one or more system qubits. The method further includes causing, by the quantum computer, performance of the initial steering circuit; and causing, by the quantum computer, initial measurement of the at least one detector qubit. The method further includes performing, by the quantum computer, one or more iterations of obtaining an updated steering circuit based at least in part on the measurement of the at least one detector qubit, causing the at least one detector qubit to be initialized into an initial detector state, and causing performance of the updated steering circuit. The method further includes determining, by the quantum computer, that the one or more system qubits are in the respective selected states.

According to yet another aspect, a quantum computer is provided. In an example embodiment, the quantum computer includes a plurality of qubits; a qubit measurement system; a qubit manipulation system; and a controller configured to control operation of the qubit manipulation system and receive input from the qubit measurement system. The controller is configured to perform at least one method disclosed herein.

According to still another aspect, a computer program product is provided. In an example embodiment, the computer program product includes a non-transitory computer-readable medium storing executable instructions. The executable instructions are configured to, when executed by a controller of a quantum computer, cause the quantum computer to perform at least one method disclosed herein.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

Figure 6:
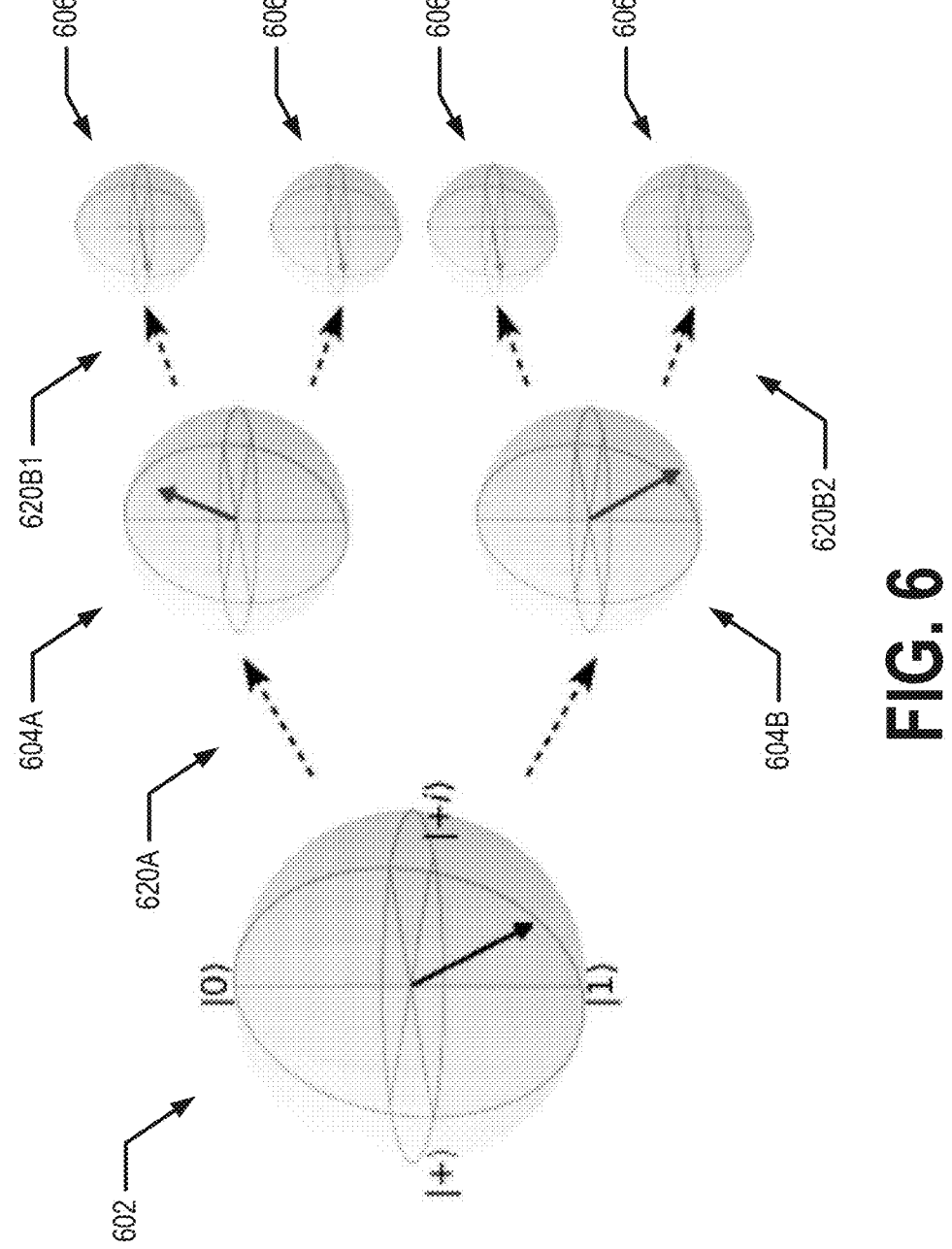

FIG. 6 provides a schematic representation of the preparation of a system qubit in a selected state, according to example embodiments.

Figure 7A:
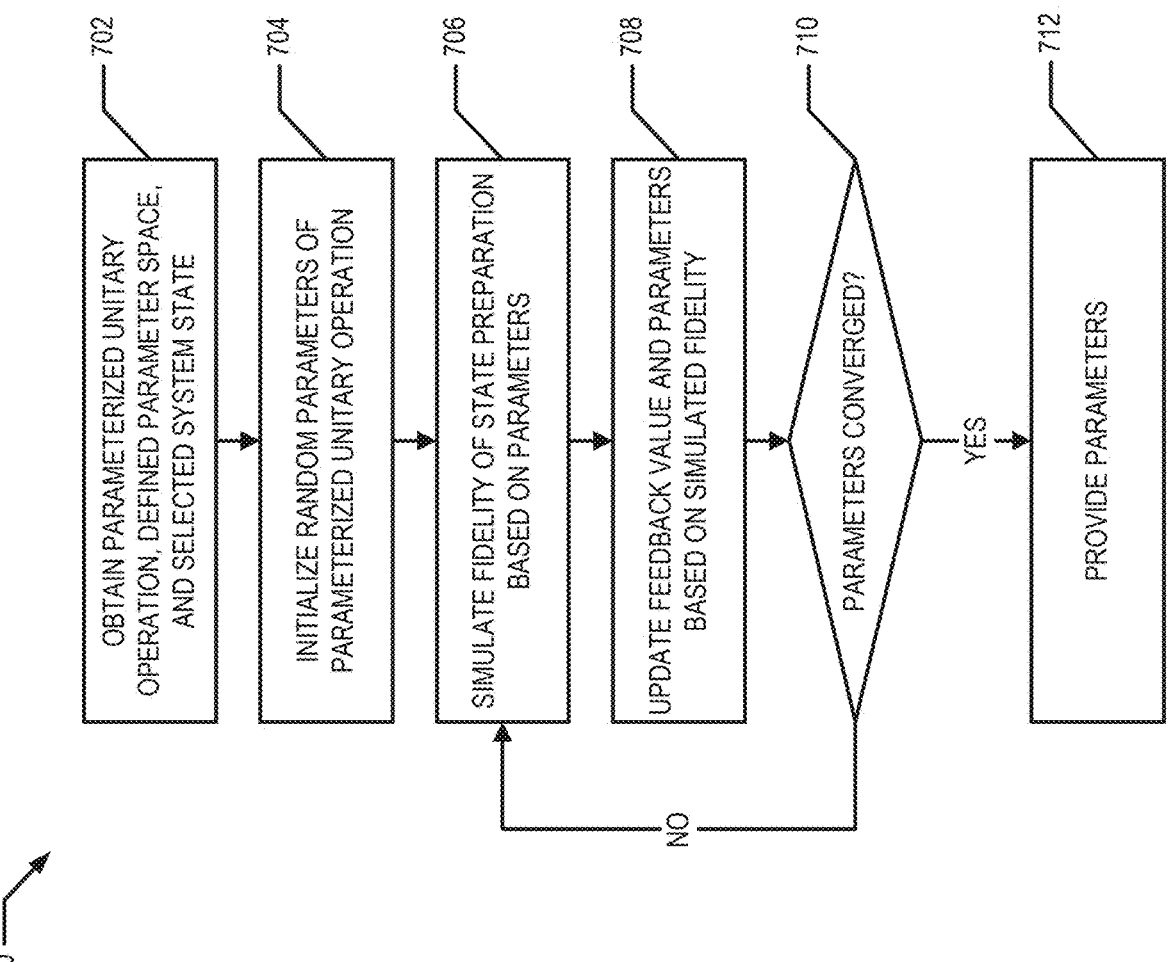

FIG. 7A is a flowchart illustrating processes, procedures, and/or operations performed by a quantum computer or classical computing entity to determine parameters of an initial unitary operator, according to an example embodiment.

FIG. 7B is a flowchart illustrating processes, procedures, and/or operations performed by a quantum computer or classical computing entity to determine updated parameters of an updated unitary operator, according to an example embodiment.

Figure 8A:
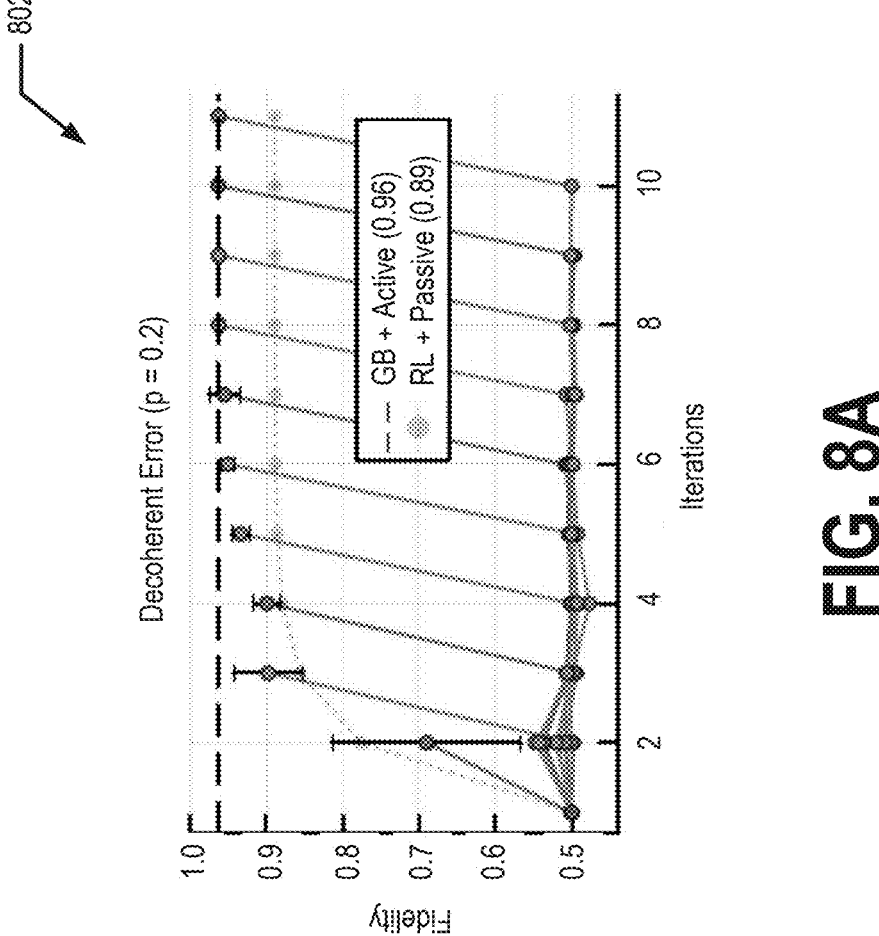
Figures 8B, 8C:
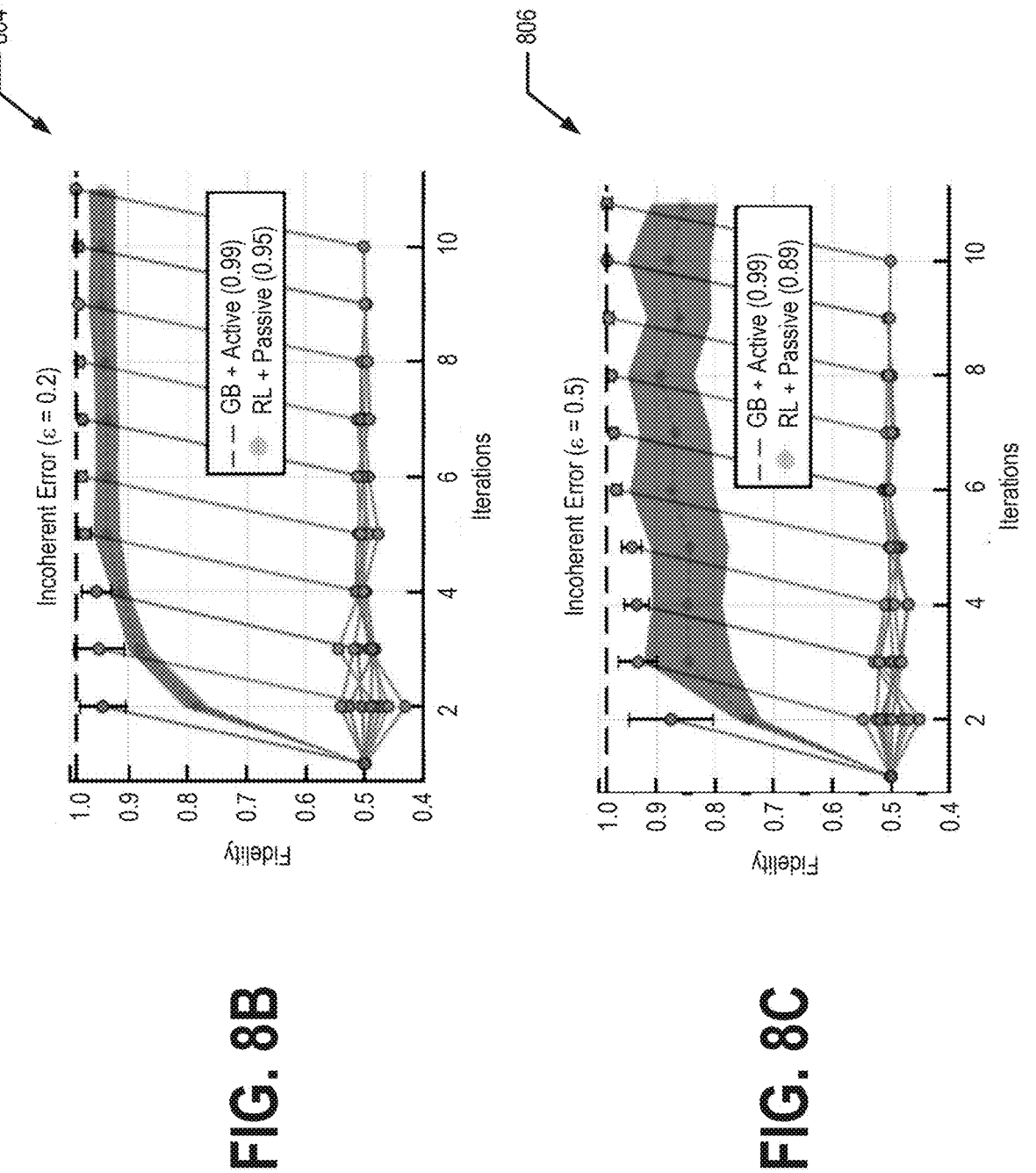

FIGS. 8A, 8B, and 8C provides respective plots showing simulation results for the fidelity of preparation of the one or more system qubits in respective selected states for passive steering and active steering for different types of system errors, according to some example embodiments.

Figure 9:
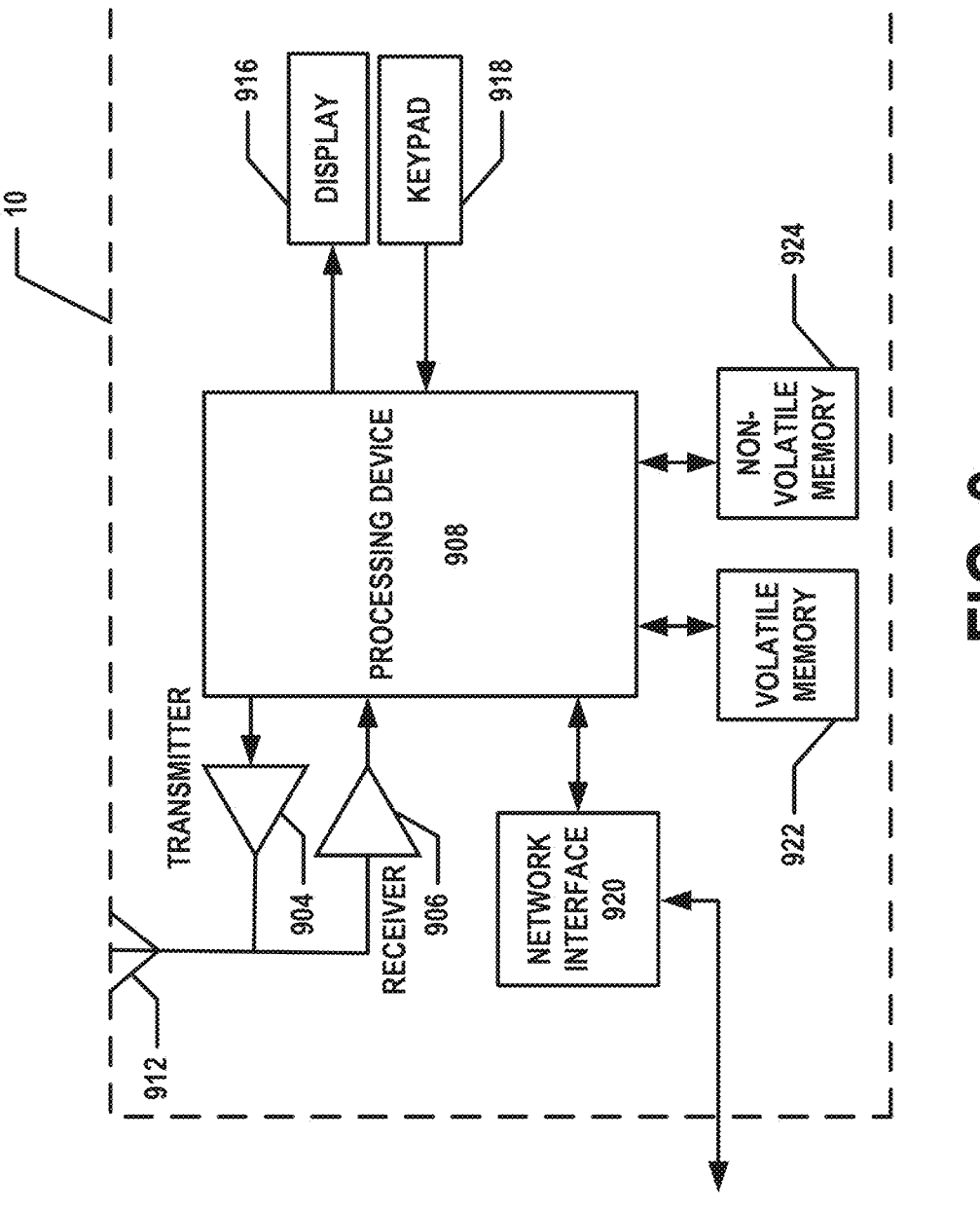

FIG. 9 provides a schematic diagram of an example classical computing entity that may be used in accordance with an example embodiment.

DETAILED DESCRIPTION OF SOME EXAMPLE EMBODIMENTS

The present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like numbers refer to like elements throughout.

Various embodiments provide methods, systems, apparatus, computer program products, and/or the like for preparing qubits of a quantum computer using quantum steering. For example, various embodiments, use quantum steering to steer system qubits into respective selected states via interactions with detector qubits, where the quantum state of the detector qubits are measured after performance of the interactions.

Quantum computing is expected to significantly outperform classical computing on many hard problems due to quantum mechanical effects such as entanglement and superposition. While a memory component of a classical computer (e.g., a bit) can only be in one possible state at a time, a memory component of a quantum computer (e.g., a qubit) can be in an arbitrary combination or superposition of states at the same time. Unfortunately, quantum computing also introduces a significant level of noise and uncertainty compared to classical computing. In some instances, the errors caused by noise and uncertainty in a quantum computation grow and propagate during the performance of the quantum computation. The results of the quantum computation are therefore not able to be usefully interpreted.

Conventional techniques for performing the initializing and/or state preparation of qubits such as Gradient Ascent Pulse Engineering (GRAPE) are open-loop techniques. For example, GRAPE evaluates and ascends along the gradients of the system qubit states to reach a desired state (or a quantum gate). However, such open-loop and/or non-feedback techniques are susceptible to parameter uncertainties and noise processes that can arise in quantum computers, leading to inaccurate predictions of the underlying quantum dynamics. Thus, such conventional techniques tend to not be able to provide system qubits in a desired state with high fidelity. Other conventional approaches for state preparation-including "repeat until success"—have two practical limitations: (i) they require many gates (area overhead) to initialize the system qubits into a selected system state, and (ii) they require many measurements (timing overhead) to ascertain high fidelity of the selected system state. Therefore, technical problems exist regarding the how to prepare one or more system qubits in respective selected states.

Various embodiments provide technical solutions to these technical problems. In particular, various embodiments employ quantum steering to prepare one or more system qubits in respective selected states with high fidelity. Quantum steering is a phenomenon in quantum mechanics whereby measurements on one system influences the state of another entangled system. In various embodiments, detector qubits are initialized into an initial state and then entangled with one or more system qubits via a steering circuit. The detector qubits are then measured to cause the respective quantum wave functions of the detector qubits to collapse to respective single states. The steering circuit is configured to steer the system qubits to respective selected states over a series or sequence of iterations. In an example embodiment, the respective selected states include one or more states that are entangled states (e.g., two or more of the system qubits are entangled with one another). In various embodiment, an initial steering circuit is used for each iteration of the series or sequence of iterations. In an example embodiment, the initial steering circuit is determined via use of a machine learning algorithm. In an example embodiment, the steering circuit for each iteration is updated based at least in part on the previous measurements of the detector qubits. For example, the steering circuit may be updated for each iteration using active feedback.

By steering the system qubits toward the respective selected states, the system qubits can be prepared into the respective selected states efficiently (e.g., with reduced space and/or time overhead) and with high fidelity. Therefore, various embodiments provide improvements to the fields of quantum computing and qubit state preparation and/or initialization.

Example System Architecture

Figure 1:
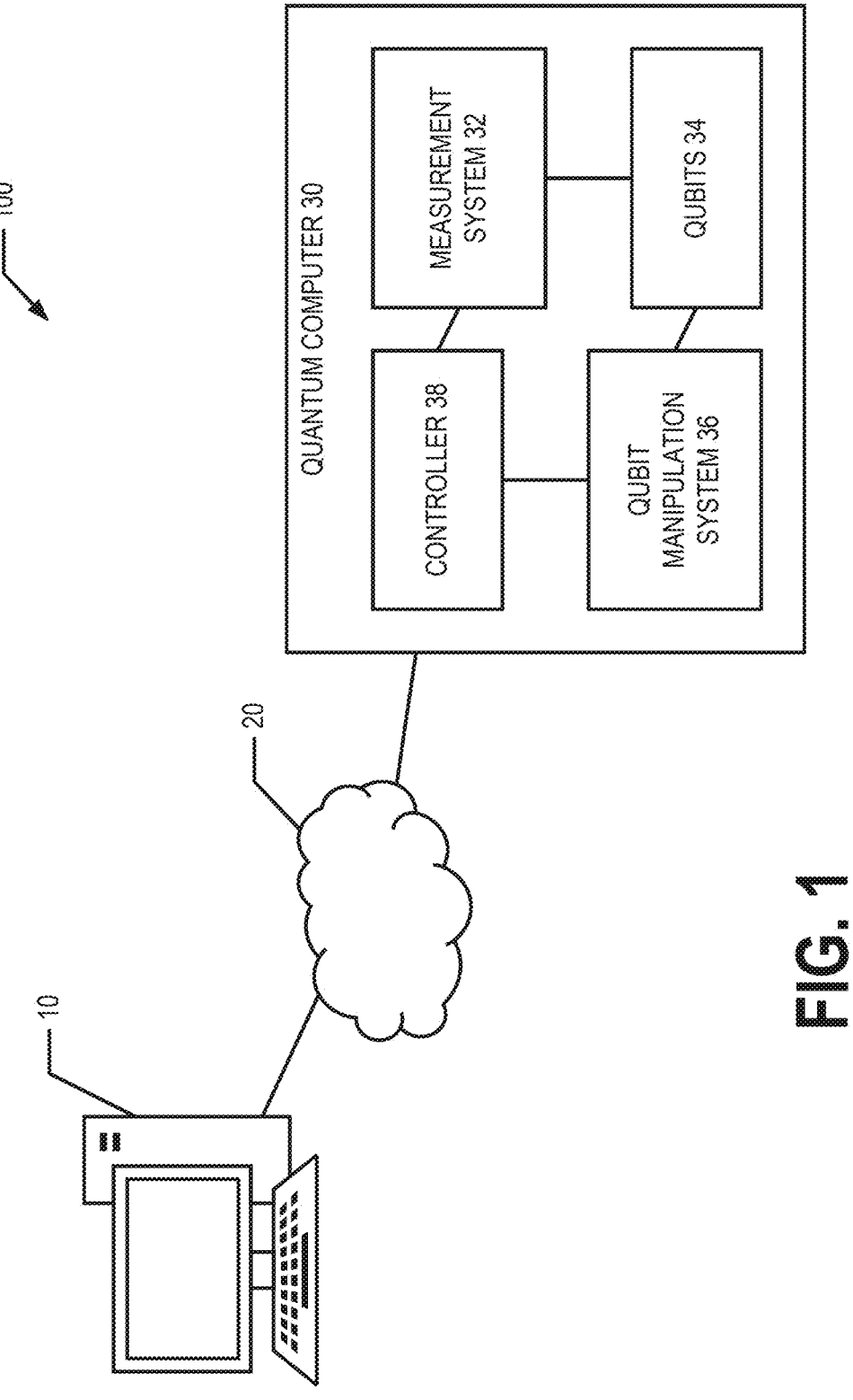
FIG. 1 is a schematic diagram illustrating an example system, according to an example embodiment.

FIG. 1 provides a block diagram of an example system 100 that maybe used in various embodiments. In various embodiments, the system 100 comprises a classical computing entity 10 and a quantum computer 30.

The quantum computer 30 comprises a controller 38, a qubit manipulation system 36, a plurality of physical qubits 34, and a qubit measurement system 32. In various embodiments, the controller 38 is configured to control operation of the qubit manipulation system 36 and to receive input from the qubit measurement system 32. The qubit manipulation system 36 is configured to perform quantum logic operations and/or gates on the physical qubits 34. The qubit measurement system 32 is configured to measure the respective quantum states of the physical qubits 34. The qubit measurement system 32 provides sensor signals and/or an indication of processing sensor signals to the controller 38 that provide an indication of the measured respective quantum states of the physical qubits 34. For example, the controller 38 may cause the quantum computer 30 to perform a quantum circuit and/or program by causing the qubit manipulation system 36 to perform a sequence of quantum logic operations indicated by the quantum circuit and/or program on the one or more physical qubits 34. In various embodiments, the quantum computer 30 is configured to perform quantum logic operations on one or more physical qubits 34 thereof. The quantum computer 30 may then use the qubit measurement system 32 to measure the respective quantum states of one or more of the physical qubits 34 as a result of the performance of the quantum circuit and/or program by the quantum computer 30.

In various embodiments, the controller 38 comprises one or more classical and/or semiconductor-based processing elements (e.g., processors, programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, graphics processing units (GPUs), central processing units (CPUs), and/or other processing circuitry) and classical and/or semiconductor-based memory (e.g., ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like). The classical and/or semiconductor-based memory stores executable instructions configured, to when executed by the classical and/or semiconductor-based processing elements of the controller 38, cause the controller 38 to control operation of the qubit manipulation system 36 to cause performance of a quantum circuit.

In various embodiments, the qubit manipulation system 36 comprises current and/or voltage sources (e.g., digital-to-analog converters (DACs), analog-to-digital converters (ADCs), arbitrary waveform generators (AWGs), and/or the like), lasers, microwave sources, magnetic field sources, and/or other components configured to interact with the physical qubits 34 and/or generate a signal configured to interact with the physical qubits 34. In various embodiments, the system qubits are physical qubits of a quantum computer and may be photons, coherent states of light, electrons, atomic nuclei, optical lattices, Josephson junctions, quantum dots, ions, atoms, non-abelian anyons, vibrational states of a particle, van der Waals heterostructures, and/or other quantum-mechanical systems. In various embodiments, the qubit measurement system 32 comprises one or more components configured to determine a quantum state of one or more of the physical qubits 34. For example, the qubit measurement system 32 comprises photodetectors (e.g., photodiodes, photomultiplier tubes, charge-coupled device (CCD) photosensors, and/or the like), magnetometers, oscillators, and/or the like. For example, the qubit manipulation system 36 and the qubit measurement system 32 comprise components configured for manipulating and/or measuring a quantum state, respectively, of the physical qubits 34 of the quantum computer 30.

In various embodiments, the quantum computer 30 is in communication with a classical computing entity 10 via one or more wired or wireless networks 20 and/or via direct wired and/or wireless communications. For example, the classical computing entity 10 may be configured to provide the quantum circuit and/or program to the quantum computer 30 and receive measured values corresponding to the qubit measurements indicating the quantum states of the one or more physical qubits 34 as a result of the performance of the quantum circuit and/or program by the quantum computer 30.

Example State Preparation of One or More System Qubits

Figure 2:
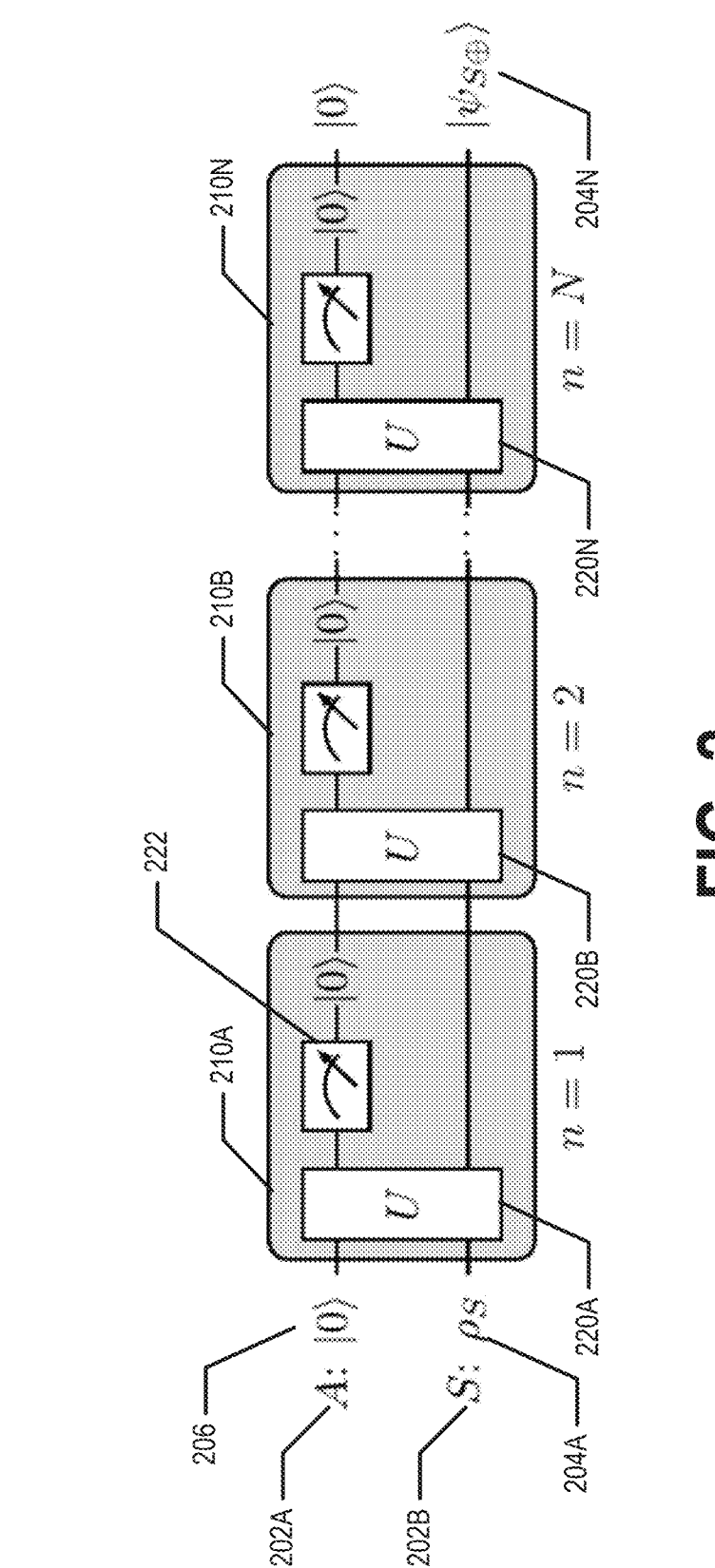
FIG. 2 is a circuit visualization of the performance of quantum steering to prepare one or more system qubits in respective selected states, according to an example embodiment.

Various embodiments provide technical solutions to the technical challenges of preparing system qubits into respective selected states through the use of quantum steering. Quantum steering, as first coined by Schrödinger, is a phenomenon in quantum mechanics whereby measurements on one system influences the state of another entangled system. As a brief visualization, FIG. 2 provides a circuit diagram representation of a steering protocol 200. The illustrated steering protocol includes one detector qubit D that is evolved along a detector qubit timeline 202A and one or more system qubits S that are collectively evolved along a system qubit timeline 202B (which is a simplified representation of the respective system qubit timelines). In various embodiments, the plurality of physical qubits 34 comprises at least one detector qubit D and one or more system qubits S. In an example embodiment, the plurality of physical qubits 34 includes a plurality of system qubits S and a plurality of detector qubits D. In various embodiments, the detector qubits D and the system qubits S are physically similar and/or identical but are used for performing different functions by the quantum computer 30. For example, the system qubits S are used to perform a quantum program and the detector qubits D are used as ancilla qubits.

The detector qubit D begins the steering protocol 200 in an initial detector state 206 (e.g., the |0> single qubit state). The one or more system qubits S begin the steering protocol 300 in an arbitrary initial system state 204A represented by the density matrix $\rho_s$. For example, the system qubits S may begin the steering protocol 200 in a random superposition of states. One or more iterations of the steering process 210 (e.g., 210A, 210B, 210C) are performed. Each steering process 210 starts with the at least one detector qubit D in the initial detector state 206 (e.g., in the |0> state) and includes performance of a steering circuit 220 and measurement 222 of the at least one detector qubit D. The at least one detector qubit D is reset to the initial detector state 206 (e.g., the |0> state) prior to performance of the next iteration of the steering process 210. Each iteration of the steering process 210 steers the state of the one or more system qubits S toward the selected state such that after performance of the Nth iteration of the steering process 210N, the one or more system qubits are in a final system state 204B which is selected system state $|\psi_{s\oplus}\rangle$. When the one or more system qubits are in the selected system state, each of the one or more system qubits are in a respective selected state. In various embodiments, one or more of the system qubits may be entangled with another when the one or more qubits are in the selected system state $|\psi_{s\oplus}\rangle$.

In various embodiments, the steering circuit 220 is a quantum circuit comprising one or more quantum interactions between at least one detector qubit and at least one system qubit that is performable by the quantum computer 30. The steering circuit 220 is configured to steer the one or more system qubits toward the respective selected states. For example, the steering circuit 220 is configured to enact a unitary operator U on the at least one detector qubit and the at least one system qubit. In various embodiments, the unitary operator is a parameterized unitary operator. For example, the parameterized unitary operator is defined in terms of one or more parameters.

In various embodiments, the one or more parameters are Euler angle coordinates $\vec{\theta}$. In an example embodiment, Euler angle coordinates $\vec{\theta}$ form a vector of scalar values where each scalar value corresponds to a respective Euler angle $\theta$ within a parameter space comprising the Euler angles. In an example embodiment, the parameter space including the Euler angles is characterized using the Gellmann basis $\vec{\lambda}$, such that the unitary operator is of the form $U=e^{i\vec{\theta}\cdot\vec{\lambda}}$, where e is Euler's number, i is the square root of negative one, and $\vec{\theta}\cdot\vec{\lambda}$ is a dot product of the Euler angle coordinates with respective Gellman basis vectors. In general, the generators of unitary operator do not commute, so an ordered summation is assumed in the representative form $U=e^{i\vec{\theta}\cdot\vec{\lambda}}$ of the unitary operator.

In various embodiments, an initial steering circuit is determined that is configured to enact an initial unitary operator. For example, the initial unitary operator may be determined using a machine learning algorithm and/or technique. For example, in an example embodiment, the initial unitary operator is determined using an unsupervised machine learning algorithm such as reinforcement learning.

Figures 3A, 3B:
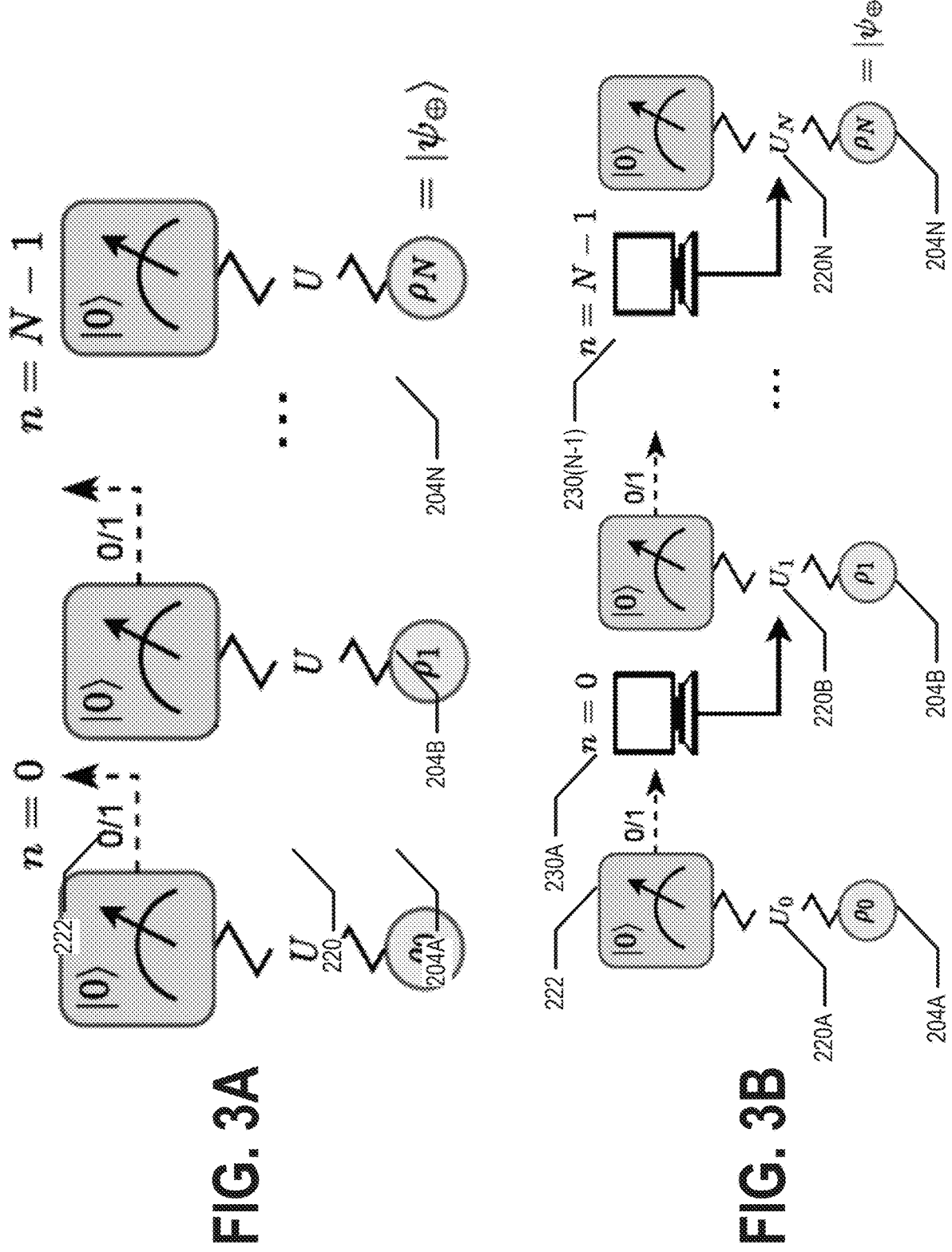
FIG. 3A is a schematic diagram illustrating an example of passive steering to prepare one or more system qubits in respective selected states, according to an example embodiment.
FIG. 3B is a schematic diagram illustrating an example of active steering to prepare one or more system qubits in respective selected states, according to an example embodiment.

In various embodiments, the steering circuit 220 of each iteration of the steering protocol 200 enacts the same unitary operator. These embodiments are referred to herein as passive steering. FIG. 3A provides a schematic illustration of a passive steering protocol. At an initial iteration, the system state 204 is an arbitrary initial system state 204A. An initial steering circuit 220 is performed to enact an initial unitary operator U on the at least one detector qubit and the one or more system qubits. The at least one detector qubit is measured via measurement 222 and then reset to the initial detector state 206. At the next iteration, the one or more system qubits are in system state 204B and the initial steering circuit 220 is performed on the at least one detector qubit and the one or more system qubits to again enact the initial unitary operator U. This process is continued for a set number of iterations (e.g., N) and/or until it is determined that the system state 204N is the selected system state $|\Psi_{s\oplus}\rangle$ (which may be determined based on measurements 222 of the at least one detector qubit). Notably, each iteration of the steering process 210 uses the same initial steering circuit enacting the same initial unitary operator (e.g., characterized by the same one or more parameters for each iteration).

In various embodiments, the steering circuit 220 of each iteration of the steering protocol 200 is updated based on the measurements 222 of the at least one detector qubit. For example, the measurements 222 of the at least one detector qubit are used as feedback that affects the unitary operator enacted by the next iteration of the steering process 210. These embodiments are referred to herein as active steering.

FIG. 3B provides a schematic illustration of an active steering protocol. At an initial iteration, the system state 204 is an arbitrary initial system state 204A. An initial steering circuit 220 is performed to enact an initial unitary operator $U_0$ on the at least one detector qubit and the one or more system qubits. The at least one detector qubit is measured via measurement 222 and then reset to the initial detector state 206. The measurement 222 of the at least one detector qubit is analyzed and/or processed to determine a respective qubit state of the at least one detector qubit. The respective qubit state of the at least one detector qubit is then used, at least in part, to determine an updated quantum circuit 220B for use in the second iteration of the steering process 210. For example, the updated quantum circuit 220B enacts an updated unitary operator $U_1$ that is determined based at least in part on the respective qubit state of the at least one detector qubit. For example, updated parameters are determined such that the updated unitary operator $U_1$ characterized by the updated parameters may be different from the initial unitary operator $U_0$ characterized by the initial parameters. For example, a parameter determination process 230A may be performed (e.g., by the quantum computer 30 and/or the classical computing entity 10) between the initial iteration of the steering process 210A and the second iteration of the steering process 210B. This process is continued, with respective parameter determination processes 230 (e.g., 230A, . . . , 230(N−1)) performed between adjacent and/or successive iterations until a set number of iterations (e.g., N) have been performed and/or until it is determined that the system state 204N is the selected system state $|\Psi_{s\oplus}\rangle$ (which may be determined based on measurements 222 of the at least one detector qubit). Notably, the steering circuit 220 is updated for each iteration. For example, the parameters of the parameterized unitary operation enacted by the steering circuit are updated for each iteration of the steering process 210.

For example, in various embodiments, the one or more parameters of the unitary operator enacted by the steering circuit 220 of an ith iteration of the steering process 210 are determined based on the state(s) of the at least one detector qubit as determined by the measurement 222 of the at least one detector qubit at iteration i-1. In an example embodiment, the one or more parameters of the unitary operator enacted by the steering circuit 220 of an ith iteration of the steering process 210 are determined based on the state(s) of the at least one detector qubit as determined by the measurement 222 of the at least one detector qubit at each of iterations i-1, i-2, . . . , 1 of the steering process 210. In an example embodiment, the one or more parameters of the unitary operator enacted by the steering circuit 220 of an ith iteration of the steering process 210 are determined based on the one or more parameters of the unitary operator enacted by the i-1th iteration of the steering process 210. In an example embodiment, the one or more parameters of the unitary operator enacted by the steering circuit 220 of an ith iteration of the steering process 210 are determined based on the one or more parameters of the unitary operator enacted by each of the i-1th, i-2th, . . . , 1st iterations of the steering process 210. In an example embodiment, the one or more parameters of the unitary operator enacted by the steering circuit 220 of an ith iteration of the steering process 210 are determined based on the measurement 222 of the at least one detector qubit at each of iterations i-1, i-2, . . . , 1 and the one or more parameters of the unitary operator enacted by each of the i-1th, i-2th, . . . , 1st iterations of the steering process 210.

In various embodiments, one or more iterations of the steering process 210 are performed to cause the system qubits to converge to respective selected states (e.g., a selected system state). In various embodiments, various tests of convergence may be used to determine when and/or whether the system qubits converge to the respective selected states. One example of such a test is the number of iterations of the quantum steering process performed. Another example test is performed by analyzing and/or processing the quantum state(s) of the at least one detector qubit determined via the measurement 222.

Example Performance of Passive Steering State Preparation

Figure 4:
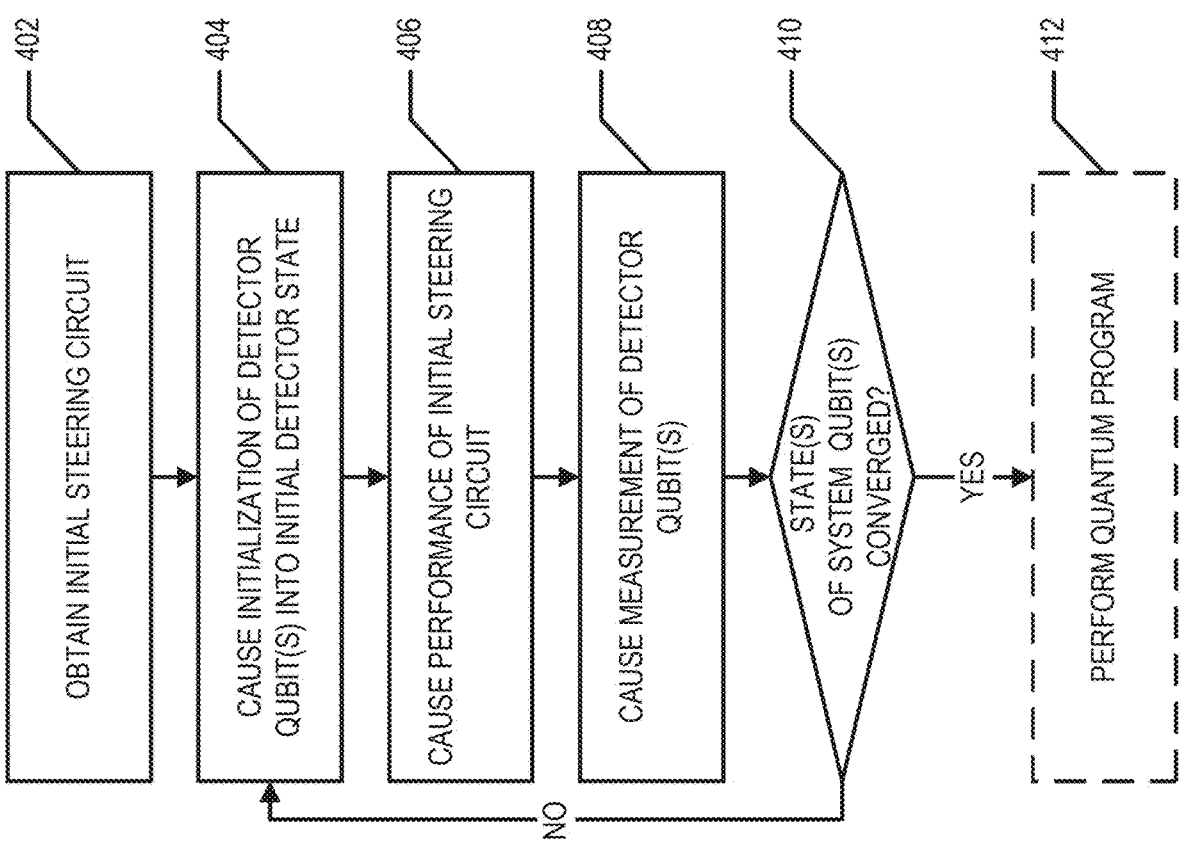
FIG. 4 is a flowchart illustrating processes, procedures, and/or operations performed by a quantum computer to prepare one or more system qubits in respective selected states using passive steering, according to an example embodiment.

FIG. 4 provides a flowchart illustrating various processes, procedures, operations, and/or the like performed by a quantum computer 30 to perform a passive steering state preparation. In various embodiments, performing passive steering state preparation includes performing N iterations of a quantum steering process using an initial quantum steering circuit at each of the N iterations to cause the one or more system qubits to converge to respective selected states (e.g., a selected system state).

Starting at step 402, an initial steering circuit is obtained. In various embodiments, the controller 38 of the quantum computer 30 obtains an initial steering circuit. In various embodiments, the initial steering circuit is received from the classical computing entity 10, accessed from a classical and/or semiconductor-based memory of the controller 38, determined and/or generated by a classical and/or semiconductor-based processing element of the controller 38 (e.g., via execution of executable instructions stored in the classical and/or semiconductor-based memory of the controller 38), and/or the like.

In various embodiments, the initial steering circuit is configured to enact an initial unitary operator. In various embodiments, the initial unitary operator is a parameterized unitary operator. For example, the parameterized unitary operator may be parameterized in terms of Euler angles and/or angles of rotation enacted via Pauli rotations (e.g., in accordance with Pauli rotation matrices).

In various embodiments, the initial steering circuit is determined in a variety of manners. In an example embodiment, the initial steering circuit is determined using a machine learning algorithm. For example, in an example embodiment, the one or more parameters of the parameterized unitary operation enacted by the initial steering circuit are determined using a machine learning algorithm as described at least in part by FIG. 8A.

Returning to FIG. 4, steps 404, 406, and 408 are iterated one or more times (e.g., N times). At step 404, the controller 38 causes the qubit manipulation system 36 to initialize one or more detector qubits into the initial detector state (e.g., |0>). In various embodiments, the process of initializing the one or more detector qubits into the initial detector state (e.g., |0>) will be specific to the particular quantum computer 30 being used.

At step 406, the controller 38 causes the qubit manipulation system 36 to perform the initial steering circuit. For example, the qubit manipulation system 36 entangles respective pairs of detector qubits and system qubits via performance of the initial steering circuit. One or more of the system qubits are each entangled with a respective detector qubit via a respective instance and/or performance of the initial steering circuit. In various embodiments, multiple instances and/or performances of the initial steering circuit may be performed simultaneously, concurrently, and/or at least partially overlapping in time. For example, if the initial steering circuit causes interaction between a single detector qubit and a single system qubit, multiple instances of the initial steering circuit may be performed at the same time such that multiple system qubits are prepared in respective selected states at least partially overlapping in time.

At step 408, the qubit measurement system 32 performs a respective measurement of each of the detector qubits. For example, the qubit measurement system 32 may interact with each of the detector qubits such that respective waveforms of the detector qubits are caused to collapse into respective single states. Because of the entanglement of a respective detector qubit with a respective system qubit, the collapse of the waveform of the respective detector qubit affects the quantum state of the respective system qubit. This effect steers the quantum state of the respective system qubit toward the respective selected state for the system qubit (e.g., a selected state within the system qubit state space).

In an example embodiment, the controller 38 analyzes and/or process information and/or sensor signals received from the measurement system 32 to determine respective quantum states of one or more of the detector qubits. In an example embodiment, the controller 38 does not analyze and/or process information and/or sensor signals received from the measurement system 32 to determine to determine respective quantum states of one or more of the detector qubits.

At step 410, the quantum computer 30 (e.g., controller 38) determines whether the states of the one or more system qubits have converged to the respective selected states (e.g., the selected system state). In various embodiments, various tests may be used to determine whether or not the states of the one or more system qubits have converged to the respective selected states.

In an example embodiment, the quantum computer 30 (e.g., controller 38) determines that the states of the one or more system qubits have converged to the respective selected states when the steering process 210 (e.g., steps 404, 406, and 408) have been performed N times. For example, responsive to determining that the steering process 210 (e.g., steps 404, 406, and 408) have been performed less than N times, the quantum computer 30 (e.g., controller 38) determines that the states of the one or more system qubits have not converged to the respective selected states and the steering process 210 is performed again. For example, responsive to determining that the steering process 210 (e.g., steps 404, 406, and 408) have been performed N times or more, the quantum computer 30 (e.g., controller 38) determines that the states of the one or more system qubits have converged to the respective selected states (e.g., the selected system state) and the process continues to step 412.

At step 412, the quantum computer 30 (e.g., controller 38) causes the qubit manipulation system 36 to cause performance of a quantum program using the system qubits. For example, the controller 38 may receive and/or access from classical and/or semiconductor-based memory executable instructions configured to, when executed by a classical and/or semiconductor-based processor of the controller 38, cause the quantum computer to perform a quantum program using the one or more system qubits.

Example Performance of Active Steering State Preparation

Figure 5:
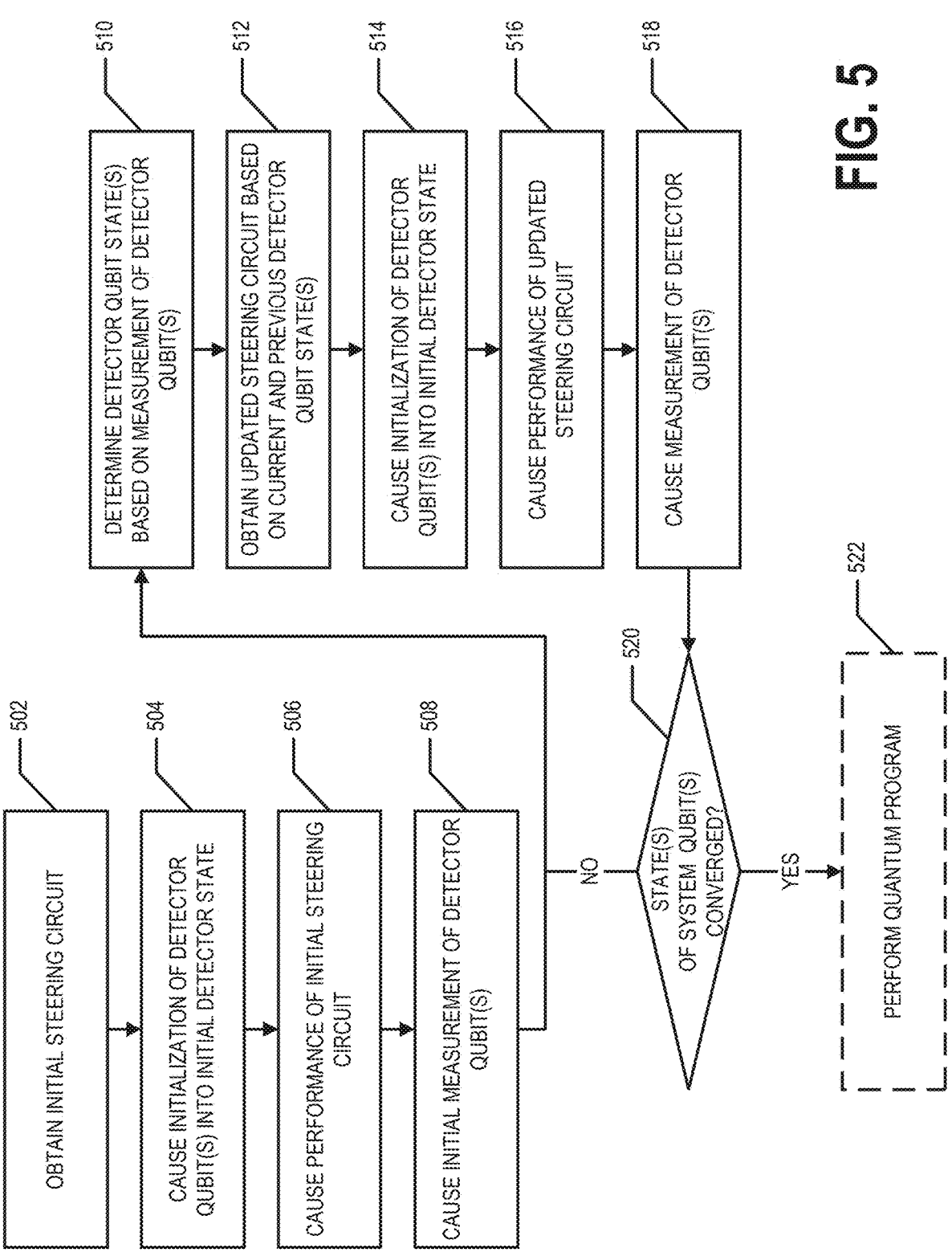
FIG. 5 is a flowchart illustrating processes, procedures, and/or operations performed by a quantum computer to prepare one or more system qubits in respective selected states using active steering, according to an example embodiment.

FIG. 5 provides a flowchart illustrating various processes, procedures, operations, and/or the like performed by a quantum computer 30 to perform an active steering state preparation. In various embodiments, performing an active steering state preparation includes performing N iterations of a quantum steering process to cause the quantum states of one or more system qubits to converge to respective selected states (e.g., a selected system state). For example, performance of an active steering state preparation steers the system qubits into the respective selected states. In various embodiments, one or more parameters of a parameterized unitary operator enacted by a steering circuit are updated each iteration based at least in part on measurements performed in one or more previous iterations.

Starting at step 502, an initial steering circuit is obtained. In various embodiments, the controller 38 of the quantum computer 30 obtains an initial steering circuit. In various embodiments, the initial steering circuit is received from the classical computing entity 10, accessed from a classical and/or semiconductor-based memory of the controller 38, determined and/or generated by a classical and/or semiconductor-based processing element of the controller 38 (e.g., via execution of executable instructions stored in the classical and/or semiconductor-based memory of the controller 38), and/or the like.

In various embodiments, the initial steering circuit is configured to enact an initial unitary operator. In various embodiments, the initial unitary operator is a parameterized unitary operator. For example, the parameterized unitary operator may be parameterized in terms of Euler angles and/or angles of rotation enacted via Pauli rotations (e.g., in accordance with Pauli rotation matrices).

In various embodiments, the initial steering circuit is determined in a variety of manners. In an example embodiment, the initial steering circuit is determined using a machine learning algorithm. For example, in an example embodiment, the one or more parameters of the parameterized unitary operation enacted by the initial steering circuit are determined using a machine learning algorithm as described at least in part by FIG. 8A.

At step 504, the controller 38 causes the qubit manipulation system 36 to initialize one or more detector qubits into the initial detector state (e.g., |0>). In various embodiments, the process of initializing the one or more detector qubits into the initial detector state (e.g., |0>) will be specific to the particular quantum computer 30 being used.

At step 506, the controller 38 causes the qubit manipulation system 36 to perform the initial steering circuit. For example, the qubit manipulation system 36 entangles respective pairs of detector qubits and system qubits via performance of the initial steering circuit. One or more of the system qubits are each entangled with a respective detector qubit via a respective instance and/or performance of the initial steering circuit. In various embodiments, multiple instances and/or performances of the initial steering circuit may be performed simultaneously, concurrently, and/or at least partially overlapping in time. For example, if the initial steering circuit causes interaction between a single detector qubit and a single system qubit, multiple instances of the initial steering circuit may be performed at the same time such that multiple system qubits are prepared in respective selected states at least partially overlapping in time.

At step 508, the qubit measurement system 32 performs a respective initial measurement of each of the detector qubits. For example, the qubit measurement system 32 may interact with each of the detector qubits such that respective waveforms of the detector qubits are caused to collapse into respective single states. Because of the entanglement of a respective detector qubit with a respective system qubit, the collapse of the waveform of the respective detector qubit affects the quantum state of the respective system qubit. This effect steers the quantum state of the respective system qubit toward the respective selected state for the system qubit (e.g., a selected state within the system qubit state space).

At step 510, the controller 38 determines the respective detector qubit states of the detector qubits based on the measurements of the detector qubits. For example, the qubit measurement system 32 generates and provides one or more sensor signals corresponding to the results of performing the measurement of the detector qubits. The controller 38 receives the one or more sensor signals and processes and/or analyzes the one or more sensor signals to determine respective detector qubit states of the detector qubits.

At step 512, the controller 38 obtains an updated steering circuit based at least in part on the respective detector qubit states. For example, the controller 38 may provide (e.g., transmit) the respective detector qubit states for receipt by the classical computing entity 10. The classical computing entity 10 may then determine an updated steering circuit based at least in part on the respective detector qubit states and/or access an updated steering circuit from memory of the classical computing entity 10 based at least in part on the respective detector qubit states. The classical computing entity 10 may then provide (e.g., transmit) the updated steering circuit for receipt by the controller 38. For example, the controller 38 may obtain the updated steering circuit by receiving the updated steering circuit.

In an example embodiment, the controller 38 obtains the updated steering circuit by determining the updated steering circuit. For example, the controller 38 may execute executable instructions stored in a classical and/or semiconductor-based memory thereof via a classical and/or semiconductor processor thereof to determine the updated steering circuit based at least in part on the respective detector qubit states. In another example, the controller 38 obtains the updated steering circuit by accessing the updated steering circuit from a classical and/or semiconductor-based memory thereof based at least in part on the respective detector qubit states.

In an example embodiment, the updated steering circuit is obtained based at least in part on the respective detector qubit states for one or more iterations of the steering process. For example, for iteration i, the updated steering circuit is obtained based at least in part on the respective detector qubit states for iterations i-1, i-2, . . . , 0, where iteration 0 was the initial iteration of the steering process (e.g., when the initial steering circuit was performed). In an example embodiment, the updated steering circuit is obtained based at least in part on the unitary operations enacted by the respective steering circuits of one or more iterations of the steering process. For example, for iteration i, the updated steering circuit is obtained based at least in part on the respective unitary operations enacted by the respective steering circuits at iterations i-1, i-2, . . . , 0, where iteration 0 was the initial iteration of the steering process (e.g., when the initial steering circuit was performed). In an example embodiment, the updated steering circuit is obtained based at least in part on a combination of the readout path (e.g., the respective detector qubit states for iterations i-1, i-2, . . . , 0, where iteration 0 was the initial iteration of the steering process) and one or more of the previously enacted unitary operators.

FIG. 6 illustrates an example in which a Bloch sphere representation of a single system qubit is guided from an arbitrary initial state 602 to a respective selected state 606. An initial steering circuit 620A is performed enacting an initial unitary operator on the single system qubit and at least one detector qubit. The at least one detector qubit is measured, resulting in the single system qubit being in one of first intermediate state 604A or second intermediate state 604B. An updated steering circuit is obtained that enacts an updated unitary operator. The updated unitary operator is determined based at least in part on the detector qubit state determined by the measurement of the at least one detector qubit and, possibly, the initial unitary operator. For example, based on the detector qubit state determined by the measurement of the at least one detector qubit, an updated steering circuit enacting a first updated unitary operator 620B1 on the single system qubit and the at least one detector qubit may be performed or an updated steering circuit enacting a second updated unitary operator 620B2 on the single system qubit and the at least one detector qubit may be performed. The at least one detector qubit is then measured, resulting in the single system qubit being steered into the respective selected state 606.

In various embodiments, the updated steering circuit is determined in a variety of manners. In an example embodiment, the updated steering circuit is determined using a machine learning algorithm. For example, in an example embodiment, the one or more parameters of the parameterized unitary operation enacted by the updated steering circuit are determined as described at least in part by FIG. 8B.

At step 514, the controller 38 causes the qubit manipulation system 36 to reinitialize one or more detector qubits into the initial detector state 206 (e.g., |0>). In various embodiments, the process of reinitializing the one or more detector qubits into the initial detector state (e.g., |0>) will be specific to the particular quantum computer 30 being used.

At step 516, the controller 38 causes the qubit manipulation system 36 to perform the updated steering circuit. For example, the qubit manipulation system 36 entangles respective pairs of detector qubits and system qubits via performance of the updated steering circuit. One or more of the system qubits are each entangled with a respective detector qubit via a respective instance and/or performance of the updated steering circuit. For example, performing the updated steering circuit may include performing one or more single qubit and/or multi-qubit (e.g., two-qubit) quantum logic operations on the at least one detector qubit and at least one system qubit.

At step 518, the qubit measurement system 32 performs a respective measurement of each of the detector qubits. For example, the qubit measurement system 32 may interact with each of the detector qubits such that respective waveforms of the detector qubits are caused to collapse into respective single states. Because of the entanglement of a respective detector qubit with a respective system qubit, the collapse of the waveform of the respective detector qubit affects the quantum state of the respective system qubit. This effect steers the quantum state of the respective system qubit toward the respective selected state for the system qubit (e.g., a selected state within the system qubit state space).

At step 520, the quantum computer 30 (e.g., controller 38) determines whether the states of the one or more system qubits have converged to the respective selected states (e.g., the selected system state). In various embodiments, various tests may be used to determine whether or not the states of the one or more system qubits have converged to the respective selected states.

In an example embodiment, the quantum computer 30 (e.g., controller 38) determines that the states of the one or more system qubits have converged to the respective selected states when the steering process 210 (e.g., steps 514, 516, and 518) have been performed N–1 times. For example, responsive to determining that the steering process 210 (e.g., steps 514, 516, and 518) have been performed less than N–1 times, the quantum computer 30 (e.g., controller 38) determines that the states of the one or more system qubits have not converged to the respective selected states and the steering process 210 is performed again. For example, responsive to determining that the steering process 210 (e.g., steps 514, 516, and 518) have been performed N–1 times or more, the quantum computer 30 (e.g., controller 38) determines that the states of the one or more system qubits have converged to the respective selected states (e.g., the selected system state) and the process continues to step 522.

At step 522, the quantum computer 30 (e.g., controller 38) causes the qubit manipulation system 36 to cause performance of a quantum program using the system qubits. For example, the controller 38 may receive and/or access from classical and/or semiconductor-based memory executable instructions configured to, when executed by a classical and/or semiconductor-based processor of the controller 38, cause the quantum computer to perform a quantum program using the one or more system qubits.

Example Determination of Parameters of an Initial Unitary Operator

In various embodiments, one or more parameters of a parameterized unitary operator are determined for use as the initial unitary operator. In various embodiments, reinforcement learning is used to determine the one or more parameters. Reinforcement involves exploration, trial and error, and feedback from the environment, which gradually trains the model. For example, reinforcement learning algorithms learn to discover optimal strategies by constantly adjusting the machine learning model's behavior based on feedback from the environment, through a series of attempts and iterations. The reinforcement learning framework consists of five core components: Agent, Environment, Action, State, and Reward.

The agent is the entity responsible for making decisions and taking actions in the environment. In the context of optimization problems, an agent can be viewed as a set of test initials to be optimized. The environment is the system that the agent interacts with. For example, the environment typically refers to the objective function that needs to be optimized. An action is a particular decision or choice made by the agent that affects the environment. For example, an action could correspond to mutating a particular set of input parameters to evaluate the objective function. A state is a description of the environment that is perceived by the agent. For example, a state could include information about the current status of the entire system, as well as any other relevant variables or parameters. The reward is a feedback signal from the environment that reflects the effect of the agent's latest action. For example, the reward is typically defined as the improvement in the objective function after applying the current set of input parameters. The goal of the agent is to maximize the expected reward over time, by learning to select actions that lead to better performance.

In various embodiments, the agent, which interacts with the environment, is chosen as the Euler angles used to compose the unitary operator matrix U corresponding to the initial unitary operator. The environment is represented as the entire quantum system that receives the composed unitary operator U to perform quantum steering. The state values record all the basic information of the interaction between the current unitary operator U and the quantum system to evaluate the reward computation.

The action space (e.g., parameter space) is defined as all possible mutations to the Euler angles, which produce an updated unitary operator U that is subsequently applied to the steering simulation. The reward-based optimization step enables the reinforcement learning model to learn a sophisticated strategy to update initial operators. However, the vast action space of Euler angles, which is encoded as a vector of real numbers, makes it impractical for direct encoding and simulation, in some embodiments. Thus, in various embodiments, a Gaussian distribution is assigned to each of the entrees within the parameter space. This produces the offset to the current entrees, and the action is chosen randomly at each step based on the parameterized distribution. This guarantees the coverage of all possible actions (e.g., full exploration of the parameter space). Moreover, the expected result of using the current unitary operator can be precisely computed, making it possible to apply policy gradient to optimize the one or more parameters during the training phase.

The reward is the most important feedback information from the environment that describes the effect of the latest action. It often refers to the benefit of performing the current unitary operator. In various embodiments, a policy gradient, a stochastic approach, is applied to compute and optimize the reward evaluation. To achieve this, the policy is represented by a function, denoted as $\pi_{74}$ (a|s), where s denotes the state and a denotes the action. The parameter $\theta$ represents the policy function. $\pi_\theta$(a|s) is the probability of selecting an action a given the state s. The objective function, which is dependent on the policy, determines the value of the reward. Gradient descent is applied, in various embodiments, to optimize $\theta$ and achieve the best reward. In an example embodiment, the complete reward function is defined as $J(\theta)=\Sigma_{s\in S} d^\pi(s) \Sigma_{a\in A} \pi_\theta(a|s) Q^\pi(s, a)$, where S and A denote the sets of all states and actions, respectively. $d^\pi(s)$ represents the stationary distribution of Markov chain for the policy function $\pi_\theta$, which is the on-policy state distribution under $\pi$. This implies that the reinforcement learning model continuously travels along the Markov chain's states until it eventually reaches a steady state probability distribution. Formally, this can be expressed as $d^\pi(s)=\lim_{t\to\infty}(s_t=s|s_0, \pi_0)$ represents the one-step reward. In various embodiments, temporary Euler angles are applied to manipulate quantum steering for several iterations, and the improvement in terms of fidelity is recorded as the Q value. However, the sets S and A are uncountable, and it is also impossible to run infinite iterations to obtain an accurate value for $d^\pi$. Therefore, in an example embodiment, $d^\pi$ is approximated by applying the current policy for ten iterations, i.e., $d^\pi(s)=P$ $(s_{10}=s|s_0, \pi_\theta)$. According to the policy gradient theorem, the gradient computation can be expressed as $\nabla J(\theta)=\nabla\Sigma_{s\in S} d^\pi(s) \Sigma_{a\in A} \pi_\theta(a|s) Q^\pi(s, a)\propto\Sigma_{s\in S} d^\pi(s) \Sigma_{a\in A} \nabla\pi_\theta(a|s) Q^\pi(s, a)$. In an example embodiment, a logarithmic loss is applied for the ease of computation.

FIG. 7A provides a flowchart illustrating a method 700 for determining an initial unitary operator. For example, the method 700 illustrates processes, procedures, operations, and/or the like performed by the controller 38 of the quantum computer 30 and/or the classical computing entity 10 for determining an initial unitary operator. In various embodiments, the determining the initial unitary operator includes determining one or more parameters of a parameterized unitary operator.

In various embodiments, the initial unitary operator is determined based at least in part on the respective selected states (e.g., the selected system state) of the one or more system qubits. For example, the initial unitary operator may be determined such that the initial unitary operator is configured to steer one or more system qubits that are in an arbitrary initial state toward the selected system state.

In various embodiments, method 700 may be performed as part of preparing to perform a quantum program with the quantum computer 30. For example, the method 700 may be performed and the determined initial unitary operator and/or determined one or more parameters of the parameterized unitary operator that is to be used as the initial unitary operator may be provided directly to a program operating on the controller 38 configured to cause performance of the initial unitary operator. In various embodiments, the method 700 is performed and the determined initial unitary operator and/or or determined one or more parameters of the parameterized unitary operator that is to be used as the initial unitary operator may be stored to a classical and/or semiconductor-based memory of the classical computing entity 10 and/or the controller 38 for later access and/or use.

In various embodiments, machine learning may be used to determine the one or more parameters of the parameterized unitary operator to be used as the initial unitary operator. For example, in an example embodiment, an unsupervised machine learning algorithm may be used to determine the one or more parameters. For example, in an example embodiment, unsupervised reinforcement learning is used to determine the one or more parameters.

Starting at step 702, a classical and/or semiconductor-based processor (e.g., of the classical computing entity 10 and/or the controller 38) obtains a parameterized unitary operation, a defined parameter space, and a selected system state.

In an example embodiment, the parameterized unitary operator is of the form $U=e^{i\vec\theta\cdot\vec\lambda}$, where e is Euler's number, i is the square root of negative one, and $\vec\theta\cdot\vec\lambda$ is a dot product of the Euler angle coordinates with respective Gellman basis vectors. In general, the generators of unitary operator do not commute, so an ordered summation is assumed in the representative form $U=e^{i\vec\theta\cdot\vec\lambda}$ of the unitary operator. In various embodiments, the defined parameter space is the Euler angles $\theta$. For example, the one or more parameters are Euler angle coordinates $\vec\theta$, in an example embodiment. In an example embodiment, Euler angle coordinates $\vec\theta$ form a vector of scalar values where each scalar value corresponds to a respective Euler angle $\theta$ within a parameter space comprising the Euler angles. In an example embodiment, the parameter space including the Euler angles is characterized using the Gellmann basis $\vec{\lambda}$.

In various embodiments, the selected system state indicates a respective selected state of each of the one or more system qubits. In various embodiments, the selected system state may include one or more individual qubits states (e.g., where the qubits are not entangled with other system qubits) and/or one or more entangled qubit states (e.g., where the qubits are entangled with at least one other system qubit).

In various embodiments, the parameterized unitary operation, defined parameter space, and selected system state are accessed from a classical and/or semiconductor-based memory of the classical computing entity 10 and/or controller 38, received via user input (e.g., via a user interface of the classical computing entity 10, and/or the like).

At step 704, the one or more parameters of the parameterized unitary operator and initialized to initial values within the parameter space. For example, the processor (e.g., of the classical computing entity 10 and/or controller 38) initializes the one or more parameters to initial values within the parameter space. For example, in an example embodiment, the one or more parameters are selected at random from the parameter space. In an example embodiment, the one or more parameters are selected based on user input (e.g., received via a user interface of the classical computing entity 10) or based on an algorithm configured to estimate the one or more parameters based on various features and/or limitations of the quantum computer 30, the selected system state, and/or the like.

At step 706, a simulation is performed to determine and/or estimate a fidelity with which the quantum computer 30 can prepare the one or more system qubits into the selected system state using the current one or more parameters of the initial unitary operator. For example, the processor (e.g., of the classical computing entity 10 and/or controller 38) causes a simulation to be performed (e.g., by the classical computing entity 10 and/or another classical computing entity) to determine and/or estimate a fidelity with which the quantum computer 30 can prepare the one or more system qubits into the selected system state an initial unitary operator as part of the steering process that includes the current one or more parameters. For example, various strategies may be used to simulate the fidelity with which the quantum computer 30 can prepare the one or more system qubits into the selected system state using an initial unitary operator including the current one or more parameters. For example, in various embodiments, a simulation toolkit such as Qiskit, Qiskit Aer, Cirq, or other toolkit enabling simulations under various noise models may be used to simulate the fidelity with which the quantum computer 30 can prepare the one or more system qubits into the selected system state using an initial unitary operator including the current one or more parameters.

At step 708, the feedback or reward is updated based on the results of the simulation and the one or more parameters are updated based on the updated feedback or reward. For example, the processor updates the feedback or reward based on the results of the simulation. The processor then updates the one or more parameters based on the updated feedback or reward. For example, in an example embodiment, the feedback or reward is updated from its current value $R=R'$ to the value $R=R'+\gamma(1\text{-fidelity})$ where the value fidelity is the fidelity of the selected system state preparation determined in step 706 and $\gamma$ is a decay ratio of the machine learning algorithm. In various embodiments, the one or more parameters are updated from the current one or more parameters $\theta$ to the parameters $\theta+\alpha\nabla_\theta J(R)$, where a is a learning rate of the machine learning algorithm, and $\nabla_\theta J(R)$ is the gradient of the reward function J, which is a function of the reward R, with respect to the one or more parameters $\theta$.

At step 710, it is determined if the parameters have converged. For example, the processor determines whether the parameters have converged. In an example embodiment, the processor determines that the parameters have converged when the number of iterations of steps 706 and 708 have reached a set number of iterations. In an example embodiment, the processor determines that the parameters have converged with the value of $\alpha\nabla_\theta J(R)$ for one or more iterations satisfies convergence threshold criteria. For example, the processor may determine that the value of $\alpha\nabla_\theta J(R)$ for one or more iterations satisfies convergence threshold criteria when the value of $\alpha\nabla_\theta J(R)$ is less than a threshold value for the one or more iterations.

When it is determined that the parameters have not converged, the process returns to steps 706. For example, steps 706 and 708 are iterated and/or repeated multiple times until the parameters are determined to have converged.

When it is determined that the parameters have converged, the process continues to step 712. At step 712, the determined one or more parameters are provided. For example, the processor may cause the determined one or more parameters to be stored in a classical and/or semiconductor-based memory of the classical computing entity 10 and/or the controller 38, displayed via a user interface of the classical computing entity 10, provided to a program operating on the controller 38, and/or the like.

Example Determination of Parameters of an Updated Unitary Operator

In various embodiments, a steering protocol 200 includes performance of a plurality (e.g., two or more) iterations of steering processes 210 with each steering process 210 including performance of a unitary operator to entangle at least one detector qubit with one or more system qubits. In various embodiments, the unitary operator is updated at each iteration through an active feedback mechanism to actively steer the quantum states of the one or more system qubits toward the selected system state.

FIG. 7B provides a flowchart illustrating a method 750 for determining an updated unitary operator. For example, the method 750 illustrates processes, procedures, operations, and/or the like performed by the controller 38 of the quantum computer 30 and/or the classical computing entity 10 for determining an updated unitary operator. In various embodiments, the determining of the updated unitary operator includes determining one or more updated parameters of a parameterized unitary operator. In various embodiments, the updated parameters are determined using a gradient-based machine learning algorithm.

In various embodiments, the updated unitary operator is determined based at least in part on the respective selected states (e.g., the selected system state) of the one or more system qubits. For example, the updated unitary operator may be determined such that the updated unitary operator is configured to steer one or more system qubits that are in a current state toward the selected system state.

In various embodiments, method 750 may be performed as part of preparing to perform a quantum program with the quantum computer 30. For example, the method 750 may be performed and the determined updated unitary operator and/or determined one or more updated parameters of the parameterized unitary operator that is to be used as the updated unitary operator may be provided directly to a program operating on the controller 38 configured to cause performance of the updated unitary operator. For example, the method 750 may be performed in real time as the quantum computer 30 is performing the steering protocol 200. For example, the performance of the method 750 may be triggered by the performance of a measurement 222 of a respective steering process 210.

In various embodiments, the method 700 is performed prior to the performance of a steering protocol and the determined updated unitary operator and/or or determined one or more updated parameters of the parameterized unitary operator that is to be used as the updated unitary operator may be stored to a classical and/or semiconductor-based memory of the classical computing entity 10 and/or the controller 38 for later access and/or use. For example, a library of sets of updated parameters may be generated and stored in memory.

In various embodiments the updated unitary operator and/or the one or more updated parameters are determined based at least in part on the result of the measurement of the detector qubits. For example, for iteration i of a steering process, the updated unitary operator and/or one or more updated parameters are determined, at least in part, based on the results of the measurements taken in iteration i-1. In various embodiments, the updated unitary operator and/or one or more updated parameters are determined, at least in part, based on the results of all of the measurements 222 that have previously been performed during the steering protocol (e.g., from iterations i-1, i-2, . . . , 0.

In various embodiments the updated unitary operator and/or the one or more updated parameters are determined based at least in part on the previous unitary operator. For example, for iteration i of a steering process, the updated unitary operator and/or one or more updated parameters are determined, at least in part, based on unitary operator used in iteration i-1 of the steering process 210. In various embodiments, the updated unitary operator and/or one or more updated parameters are determined, at least in part, based on all of the unitary operators that have been performed during previous iterations of the steering process 210 during the steering protocol 200 (e.g., from iterations i-1, i-2, . . . , 0.

In various embodiments, machine learning may be used to determine the one or more parameters of the parameterized unitary operator to be used as the initial unitary operator. For example, in an example embodiment, an unsupervised machine learning algorithm may be used to determine the one or more parameters. For example, in an example embodiment, unsupervised reinforcement learning is used to determine the one or more parameters.

Starting at step 752, a classical and/or semiconductor-based processor (e.g., of the classical computing entity 10 and/or the controller 38) obtains a parameterized unitary operation, a defined parameter space, and a selected system state.

In an example embodiment, the parameterized unitary operator is of the form $U=e^{i\vec{\theta}\cdot\vec{\lambda}}$, where e is Euler's number, i is the square root of negative one, and $\vec{\theta}\cdot\vec{\lambda}$ is a dot product of the Euler angle coordinates with respective Gellman basis vectors. In general, the generators of unitary operator do not commute, so an ordered summation is assumed in the representative form $U=e^{i\vec{\theta}\cdot\vec{\lambda}}$ of the unitary operator. In various embodiments, the defined parameter space is the Euler angles θ. For example, the one or more parameters are Euler angle coordinates $\vec{\theta}$, in an example embodiment. In an example embodiment, Euler angle coordinates $\vec{\theta}$ form a vector of scalar values where each scalar value corresponds to a respective Euler angle θ within a parameter space comprising the Euler angles. In an example embodiment, the parameter space including the Euler angles is characterized using the Gellmann basis $\vec{\lambda}$.

In various embodiments, the selected system state indicates a respective selected state of each of the one or more system qubits. In various embodiments, the selected system state may include one or more individual qubits states (e.g., where the qubits are not entangled with other system qubits) and/or one or more entangled qubit states (e.g., where the qubits are entangled with at least one other system qubit).

In various embodiments, the parameterized unitary operation, defined parameter space, and selected system state are accessed from a classical and/or semiconductor-based memory of the classical computing entity 10 and/or controller 38, received via user input (e.g., via a user interface of the classical computing entity 10, and/or the like).

At step 754, the classical and/or semiconductor-based processor (e.g., of the classical computing entity 10 and/or the controller 38) obtains measurement results of one or more previous iterations and/or the unitary operators (and/or parameters thereof) of one or more previous iterations. For example, when determining the updated unitary operator and/or parameters thereof for iteration i, the processor may access the measurement results from iterations i-1, i-2, . . . , 0 from a classical and/or semiconductor-based memory of the classical computing entity 10 and/or the controller 38.

At step 756, the processor determines the overall cumulative error. In various embodiments, the overall cumulative error is defined in terms of the final fidelity of the state preparation of the one or more system qubits into the selected system state. For example, for a sequence of measurement results r, the overall cumulative error may be written as $$ J(r) = 1 - \langle\psi_\oplus|\rho_s^n(r)|\psi_\oplus\rangle, \text{ where } |\psi_\oplus\rangle $$

is the selected system state and $$ \rho_s^n $$

is the final system state after applying n-repetitions of the steering process. For example, $$ \rho_s^n $$

is the system state of the one or more system qubits after performance of the n-th iteration of the steering process.

At step 758, the processor determines the gradient of the overall cumulative error with respect to the parameters θ. In various embodiments, the unitary operators are differentiable with respect to the parameters θ. However, the dependence of the unitary operators on measurement readouts is not straight forward. In particular, the measurements 222 are performed on the detector qubits and not on the system qubits. To account for this, in an example embodiment, the evaluation of gradient of the overall cumulative error with respect to the parameters θ is determined by summing over all readout paths (e.g., the possible system qubit state paths that resulted in the measurement results indicating the detector qubit states). Thus, in various embodiments, the processor determines the overall cumulative error as $$\langle J \rangle_r = \sum_r P^n(r) J(\rho_s^n), \text{ where } P^n(r)$$

is the cumulative probability of the path defined through the previous measurement results r for the iteration n. For example, the overall cumulative error is a sum of all the final fidelities at step n for all possible sequences of measurement results.

In an example embodiment, the evaluation of the gradient of the overall cumulative error with respect to the parameters $\nabla_\theta \langle J \rangle_r$ is performed using an analytical expression to obtain expressions for the gradients that may be evaluated numerically. In an example embodiment, the evaluation of the gradient of the overall cumulative error with respect to the parameters $\theta$ is performed using automatic differentiation.

At step 760, the parameters $\theta$ are updated based on the gradient of the overall cumulative error with respect to the parameters $\nabla_\theta \langle J \rangle_r$. In various embodiments, the one or more parameters are updated from the current one or more parameters $\theta$ to the one or more parameters $\theta + \alpha \nabla_\theta \langle J \rangle_r$, where $\alpha$ is a learning rate of the machine learning algorithm.

At step 762, the determined one or more parameters are provided. For example, the processor may cause the determined one or more parameters to be stored in a classical and/or semiconductor-based memory of the classical computing entity 10 and/or the controller 38, displayed via a user interface of the classical computing entity 10, provided to a program operating on the controller 38, and/or the like.

Technical Advantages

Conventional techniques for performing the initializing and/or state preparation of qubits such as Gradient Ascent Pulse Engineering (GRAPE) are open-loop techniques. For example, GRAPE evaluates and ascends along the gradients of the system qubit states to reach a desired state (or a quantum gate). However, such open-loop and/or non-feedback techniques are susceptible to parameter uncertainties and noise processes that can arise in quantum computers, leading to inaccurate predictions of the underlying quantum dynamics. Thus, such conventional techniques tend to not be able to provide system qubits in a desired state with high fidelity. Other conventional approaches for state preparation—including "repeat until success"—have two practical limitations: (i) they require many gates (area overhead) to initialize system qubits into a selected system state, and (ii) they require many measurements (timing overhead) to ascertain high fidelity of the selected system state. Therefore, technical problems exist regarding the how to prepare one or more system qubits in respective selected states.

Various embodiments provide technical solutions to these technical problems. In particular, various embodiments employ quantum steering to prepare one or more system qubits in respective selected states with high fidelity. Quantum steering is a phenomenon in quantum mechanics whereby measurements on one system influences the state of another entangled system. In various embodiments, detector qubits are initialized into an initial state and then entangled with one or more system qubits via a steering circuit. The detector qubits are then measured to cause the respective quantum wave functions of the detector qubits to collapse to respective single states. The steering circuit is configured to steer the system qubits to respective selected states over a series or sequence of iterations. In an example embodiment, the respective selected states include one or more states that are entangled states (e.g., two or more of the system qubits are entangled with one another). In various embodiment, an initial steering circuit is used for each iteration of the series or sequence of iterations. In an example embodiment, the initial steering circuit is determined via use of a machine learning algorithm. In an example embodiment, the steering circuit for each iteration is updated based at least in part on the previous measurements of the detector qubits. For example, the steering circuit may be updated for each iteration using active feedback.

For example, FIGS. 8A, 8B, and 8C provide plots 802, 804, and 786, respectively, that illustrate the fidelity with which state preparation of system qubits may be performed using active steering state preparation and passive steering state preparation for various noise characteristics of a quantum computer 30 for various numbers of iterations of the steering process, according to an example embodiment.

For example, plot 802 illustrates state preparation fidelity as a function of number of iterations of the steering process for a quantum computer 30 having decoherent error p=0.2. Decoherent noise is the result of the detector qubits not being able to be initialized into a perfect pure initial detector state 206. For example, a detector qubit may be initialized into a state of $\alpha|0\rangle + b|\Psi\rangle$, where $|\Psi\rangle$ is an arbitrary state (possibly a mixed state) of the detector qubit and $|\alpha|^2 + |b|^2 = 1$. The strength of the decoherent noise is characterized by the decoherent error p, such that if the state of a system qubit is given by p, the depolarizing noise will map the state of the system qubit to $$E(\rho) = (1 - p)\rho + \frac{p}{M},$$

where/M is the mixed state of the detector qubit. As shown in plot 802, use of active steering using gradient-based (GB) determination of the updated unitary operators (e.g., as shown in FIG. 7B) results in a state preparation fidelity of 0.96 when six or more iterations are performed and use of passive steering using reinforcement learning of the initial unitary operator (e.g., as shown in FIG. 7A) results in a state preparation fidelity of 0.89, even with decoherent noise present in the quantum computer.

In another example, plots 804 and 806 illustrate respective state preparation fidelities as a function of iterations of the steering process for quantum computers having different amounts of incoherent error $\zeta$. Incoherent noise arises from fluctuations within the quantum system itself. Examples of incoherent noise include random variations in the amplitude or phase of the qubits or gates, as well as errors in the initialization or measurement of qubits. The incoherent error $\varepsilon$ indicates the strength of a perturbation experienced by the system qubits as a result of incoherent noise of the quantum computer. As shown in plot 806, even with a significant amount of incoherent error (e.g., $\varepsilon = 0.5$), use of active steering using gradient-based (GB) determination of the updated unitary operators (e.g., as shown in FIG. 7B) results in a state preparation fidelity of 0.99 when eight or more iterations are performed and use of passive steering using reinforcement learning of the initial unitary operator (e.g., as shown in FIG. 7A) results in a state preparation fidelity of 0.89, even with incoherent noise present in the quantum computer.

Thus, by steering the system qubits toward the respective selected states, the system qubits can be prepared into the respective selected states efficiently (e.g., with reduced space and/or time overhead) and with high fidelity. Therefore, various embodiments provide improvements to the fields of quantum computing and qubit state preparation and/or initialization.

Exemplary Classical Computing Entity

FIG. 9 provides an illustrative schematic representative of an example classical computing entity 10 that can be used in conjunction with embodiments of the present disclosure. As used herein, the term "classical" refers to semiconductor-based computing (e.g., semiconductor-based processing elements, semiconductor-based memory, and/or the like). In various embodiments, a classical computing entity 10 is configured to interface with a quantum computer 30. In various embodiments, the classical computing entity 10 is configured to interface with a quantum computer 30 so as to provide a steering circuit and/or other quantum circuits to the quantum computer 30 for performance and/or storage thereof, enable the classical computing entity 10 to receive qubit measurements, and/or the like. For example, the classical computing entity 10 may be configured to communicate with the quantum computer 30 to allow a user (e.g., a human user or a program operating on the classical computing entity 10) to receive, display, analyze, and/or the like output from the quantum computer 30.

As shown in FIG. 9, a classical computing entity 10 can include an antenna 912, a transmitter 904 (e.g., radio), a receiver 906 (e.g., radio), and a processing device 908 that provides signals to and receives signals from the transmitter 904 and receiver 906, respectively. The signals provided to and received from the transmitter 904 and the receiver 906, respectively, may include signaling information/data in accordance with an air interface standard of applicable wireless systems to communicate with various entities, such as a quantum computer 30, other classical computing devices, and/or the like. In this regard, the classical computing entity 10 may be capable of operating with one or more air interface standards, communication protocols, modulation types, and access types.

For example, the classical computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the classical computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1x (1xRTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol. The classical computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/ Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the classical computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The classical computing entity 10 can also download changes, add-ons, and updates, for instance, to its firmware, software (e.g., including executable instructions, applications, program modules), and operating system.

In various embodiments, the classical computing entity 10 may comprise a network interface 920 for interfacing and/or communicating with the quantum computer 30 and/or other classical computing devices, for example. In various embodiments, the classical computing entity 10 and the quantum computer 30 may communicate via a direct wired and/or wireless connection and/or via one or more wired and/or wireless networks 20.

In various embodiments, the processing device 908 may comprise one or more processing elements such as programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, graphics processing units (GPUs), central processing units (CPUs), other processing devices and/or circuitry, and/or the like. The term circuitry may refer to an entirely hardware embodiment or a combination of hardware and computer program products.

The classical computing entity 10 may also comprise a user interface device comprising one or more user input/ output interfaces (e.g., a display 916 and/or speaker/speaker driver coupled to a processing device 908 and a touch screen, keyboard, mouse, and/or microphone coupled to a processing device 908). For instance, the user output interface may be configured to provide an application, browser, user interface, interface, dashboard, screen, webpage, page, and/or similar words used herein interchangeably executing on and/or accessible via the classical computing entity 10 to cause display or audible presentation of information/data and for interaction therewith via one or more user input interfaces. The user input interface can comprise any of a number of devices allowing the classical computing entity 10 to receive data, such as a keypad 918 (hard or soft), a touch display, mouse, voice/speech or motion interfaces, scanners, readers, or other input device. In embodiments including a keypad 918, the keypad 918 can include (or cause display of) the conventional numeric (0-9) and related keys (#, *), and other keys used for operating the classical computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the classical computing entity 10 can collect information/data, user interaction/input, and/or the like.

The classical computing entity 10 can also include (classical) volatile storage or memory 922 and/or non-volatile storage or memory 924, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the classical computing entity 10 (e.g., such as the distribution function discriminator).

CONCLUSION

Many modifications and other embodiments of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for preparing one or more system qubits in respective selected states, the method comprising:
   obtaining an initial steering circuit, wherein the initial steering circuit is a quantum circuit comprising one or more quantum interactions between at least one detector qubit and the one or more system qubits that is performable by a quantum computer, wherein the quantum computer comprises a plurality of physical qubits that includes the at least one detector qubit and the one or more system qubits and wherein the one or more quantum interactions are characterized by a parameterized unitary operator, one or more parameters of the parameterized unitary operator determined using machine learning;
   performing, by the quantum computer, one or more iterations of:
      causing the at least one detector qubit to be initialized into an initial detector state,
      causing performance of the initial steering circuit, and
      causing measurement of the at least one detector qubit; and
   determining, by the quantum computer, that the one or more system qubits are in the respective selected states.

2. The method of claim 1, wherein determining the one or more parameters of the parametrized unitary operator using the machine learning comprises:
   initializing the one or more parameters within a parameter space based at least in part on one or more initial selection criteria; and performing one or more iterations of:
      determining a fidelity of state preparation based on the one or more parameters,
      determining a feedback value based at least in part on the fidelity of state preparation, and
      updating the one or more parameters based at least in part on the feedback value.

3. The method of claim 1, wherein the one or more parameters are determined from a parameter space comprising generalized Euler angles for an associated special unitary lie algebra.

4. The method of claim 1, wherein the parameterized unitary operator comprises a set of Pauli rotations.

5. The method of claim 1, wherein the quantum computer does not process the measurement of the at least one detector qubit.

6. The method of claim 1, wherein each iteration of the one or more iterations further comprises:
   analyzing the measurement of the at least one detector qubit to determine a respective detector state of the at least one detector qubit; and
   obtaining an updated steering circuit based at least in part on the respective detector state,
   wherein in a next iteration of the one or more iterations, the updated steering circuit is performed in place of the initial steering circuit.

7. The method of claim 6, wherein obtaining the updated steering circuit comprises obtaining one or more updated parameters of the parameterized unitary operator.

8. The method of claim 7, wherein one of:
   the one or more updated parameters of the parameterized unitary operator are determined in real time with respect to performance of the one or more iterations; or
   the one or more updated parameters of the parameterized unitary operator are accessed from memory based at least in part on the respective detector state of the at least one detector qubit.

9. A method for preparing one or more qubits in respective selected states, the method comprising:
   obtaining an initial steering circuit, wherein the initial steering circuit is a quantum circuit comprising one or more quantum interactions between at least one detector qubit and one or more system qubits that is performable by a quantum computer, wherein the quantum computer comprises a plurality of physical qubits that includes the at least one detector qubit and the one or more system qubits;
   causing, by the quantum computer, performance of the initial steering circuit;
   causing, by the quantum computer, a measurement of the at least one detector qubit;
   performing, by the quantum computer, one or more iterations of:
      obtaining an updated steering circuit based at least in part on the measurement of the at least one detector qubit,
      causing the at least one detector qubit to be initialized into an initial detector state, and
      causing performance of the updated steering circuit, and
   determining, by the quantum computer, that the one or more system qubits are in the respective selected states.

10. The method of claim 9, wherein the initial steering circuit is determined using a machine learning algorithm.

11. The method of claim 9, wherein the initial steering circuit is configured to enact a parameterized unitary operator and one or more parameters of the parameterized unitary operator are determined using machine learning.

12. The method of claim 9, wherein the updated steering circuit is configured to enact a parameterized unitary operator and obtaining the updated steering circuit comprises obtaining one or more updated parameters of the parameterized unitary operator.

13. The method of claim 12, wherein the one or more updated parameters are determined based at least in part on the measurement of the at least one detector qubit.

14. The method of claim 12, wherein the initial steering circuit is configured to enact an initial unitary operator and the one or more updated parameters are determined based at least in part on the initial unitary operator, any parameterized unitary operators already performed during the one or more iterations, the measurement of the at least one detector qubit, and any measurements of the at least one detector qubit already performed during the one or more iterations.

15. The method of claim 12, wherein the one or more updated parameters are determined from a parameter space comprising generalized Euler angles for an associated special unitary lie algebra.

16. The method of claim 12, wherein the parameterized unitary operator comprises a set of Pauli rotations.

17. The method of claim 12, wherein the one or more updated parameters are determined based at least in part on a gradient of an overall cumulative error of respective states of the one or more system qubits with respect to parameters of the parameterized unitary operator.

18. The method of claim 9, further comprising performing a quantum program using the one or more system qubits.

19. The method of claim 9, wherein the updated steering circuit is obtained by determining the updated steering circuit in real time during preparation of the one or more qubits in the respective selected states.

20. The method of claim 9, wherein the updated steering circuit is obtained by accessing the updated steering circuit from memory.

* * * * *